United States Patent
Han et al.

(10) Patent No.: US 11,211,920 B2
(45) Date of Patent: Dec. 28, 2021

(54) LEVEL SHIFTER CIRCUITRY AND ELECTRONIC APPARATUS INCLUDING THE SAME

(71) Applicant: Samsung Electronics Co., Ltd., Suwon-si (KR)

(72) Inventors: Jae Seung Han, Hwaseong-si (KR); Kyung-Min Kim, Seoul (KR); Hae Sick Sul, Hwaseong-si (KR); Yun Hwan Jung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/038,965

(22) Filed: Sep. 30, 2020

(65) Prior Publication Data

US 2021/0250020 A1 Aug. 12, 2021

(30) Foreign Application Priority Data

Feb. 10, 2020 (KR) .................. 10-2020-0015680

(51) Int. Cl.
| | |
|---|---|
| *H03K 19/0185* | (2006.01) |
| *H03K 19/0175* | (2006.01) |
| *H03L 5/00* | (2006.01) |
| *H03K 3/356* | (2006.01) |

(52) U.S. Cl.
CPC . *H03K 3/356113* (2013.01); *H03K 3/356182* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 6,429,716 B1* | 8/2002 | Drapkin | ........... | H03K 19/00315 323/313 |
| 6,801,064 B1* | 10/2004 | Hunt | .................. | H03K 19/0013 326/63 |
| 7,053,657 B1* | 5/2006 | Peng | ................ | H03K 3/356113 326/68 |
| 7,215,146 B2* | 5/2007 | Khan | ............... | H03K 3/356113 326/68 |
| 7,663,423 B1* | 2/2010 | Cheng | .............. | H03K 3/356113 327/333 |
| 7,710,182 B2* | 5/2010 | Yu | .......................... | H03K 3/012 327/333 |
| 7,834,661 B2 | 11/2010 | Ku et al. | | |
| 7,994,821 B1 | 8/2011 | Wang et al. | | |
| 8,564,357 B2 | 10/2013 | Kimoto | | |
| 8,766,696 B2 | 7/2014 | Gazit | | |
| 8,791,743 B1 | 7/2014 | Tang et al. | | |
| 9,246,493 B2 | 1/2016 | Kawasaki | | |
| 9,559,673 B2 | 1/2017 | Grubelich | | |

(Continued)

*Primary Examiner* — Kenneth B Wells
(74) *Attorney, Agent, or Firm* — Harness, Dickey & Pierce, P.L.C.

(57) ABSTRACT

A level shifter circuitry is provided. The level shifter circuitry includes a first sub-circuit connected to a first power supply voltage, a second sub-circuit connected to a second power supply voltage and a shifting circuit which is connected to the first and second sub-circuits and outputs the first power supply voltage or the second power supply voltage to an output terminal or an inverted output terminal in response to a signal applied to an input node in accordance with an enable signal.

18 Claims, 16 Drawing Sheets

(56) References Cited

U.S. PATENT DOCUMENTS

| | | |
|---|---|---|
| 9,584,125 B2 | 2/2017 | Tsuji |
| 9,647,660 B1* | 5/2017 | Alam ............... H03K 3/356113 |
| 10,187,061 B1* | 1/2019 | Venugopal ............. H03K 3/037 |
| 2009/0206878 A1* | 8/2009 | Fan .................. H03K 3/356139 |
| | | 326/80 |
| 2011/0102383 A1* | 5/2011 | Cho ........................ G09G 3/20 |
| | | 345/204 |
| 2018/0248551 A1* | 8/2018 | Mallia ................ H03K 3/35613 |

* cited by examiner

LEVEL SHIFTER CIRCUITRY AND ELECTRONIC APPARATUS INCLUDING THE SAME

CROSS-REFERENCE TO RELATED APPLICATION

This application claims priority from Korean Patent Application No. 10-2020-0015680 filed on Feb. 10, 2020 in the Korean Intellectual Property Office, and all the benefits accruing therefrom under 35 U.S.C. 119, the contents of which in its entirety are herein incorporated by reference.

BACKGROUND

1. Field of the Invention

The present inventive concepts relate to level shifter circuitry.

2. Description of the Related Art

In general, there is a case where a voltage level shifter may be required for an interface between circuits that require different voltage levels in the design of a semiconductor integrated circuit. For example, although an integrated circuit such as a semiconductor operates in a specified voltage range, a signal voltage higher than a defined voltage range may be required to interface with external circuits or provide signals to other circuits. A level shifter used in such a case is a circuit that is located between two systems to change magnitudes of signal voltage when connecting two systems with different magnitudes of signal voltage. Such a level shifter is used particularly when the magnitude of the signal voltage is changed from a small voltage range to a large voltage range.

In particular, a level shifter which converts a signal of a lower voltage level into a signal of a higher voltage level is required to drive a boost converter having a higher output voltage, and a step-down converter or a push-pull circuit having a higher input voltage.

SUMMARY

Aspects of the present inventive concepts provide level shifter circuitry having a small layout area.

Aspects of the present inventive concepts also provide level shifter circuitry in which a supply voltage margin and a gain are improved.

One aspect of the present inventive concepts provides level shifter circuitry which includes a first sub-circuit connected to a first power supply voltage, a second sub-circuit connected to a second power supply voltage and a shifting circuit which is connected to the first and second sub-circuits and outputs the first power supply voltage or the second power supply voltage to an output terminal or an inverted output terminal in response to a signal applied to an input node in accordance with an enable signal.

Another aspect of the present inventive concepts provides level shifter circuitry which includes at least two first pull-up transistors connected in series between a first power supply terminal and a first node, at least two second pull-up transistors connected in parallel to the first pull-up transistors and connected in series between the first power supply terminal and a second node, at least two first pull-down transistors connected in series between the first node and a second power supply terminal and at least two second pull-down transistors connected in series between the second power supply terminal and the second node, wherein at least one second pull-up transistor facing at least one first pull-up transistor is cross-coupled, and at least one second pull-down transistor facing at least one first pull-down transistors is cross-coupled to output an inverted output signal from the first node and output an output signal from the second node.

Other aspects of the present inventive concepts provide an image sensor which includes a first layer including a pixel array and a second layer disposed below the first layer and including a row driver for driving the pixel array, wherein the row driver includes a plurality of level shifter circuits disposed in an array, each of the level shifter circuits includes at least two first pull-up transistors connected in series between a first power supply terminal and a first node, at least two second pull-up transistors connected in parallel to the first pull-up transistors and connected in series between the first power supply terminal and a second node, at least two first pull-down transistors connected in series between the first node and a second power supply terminal and at least two second pull-down transistors connected in series between the second power supply terminal and the second node, wherein at least one second pull-up transistor facing at least one first pull-up transistor is cross-coupled, and at least one second pull-down transistor facing at least one first pull-down transistor is cross-coupled to output an inverted output signal from the first node and output an output signal from the second node.

DETAILED DESCRIPTION OF EXAMPLE EMBODIMENTS

Hereinafter, some example embodiments according to the technical idea of the present inventive concepts will be described with reference to the attached drawings.

Prior to the explanation of the present inventive concepts, a power supply voltage VDD and an input power supply voltage VDDI specified in a circuit may be the same as a system power supply voltage, or may be voltages adjusted from the system power supply voltage and different from each other, depending on various example embodiments. Also, an input ground voltage VSSI specified in the circuit may be the same as the system ground voltage, or may be adjusted from the system ground voltage and different from each other, depending on various example embodiments.

Figure 1:
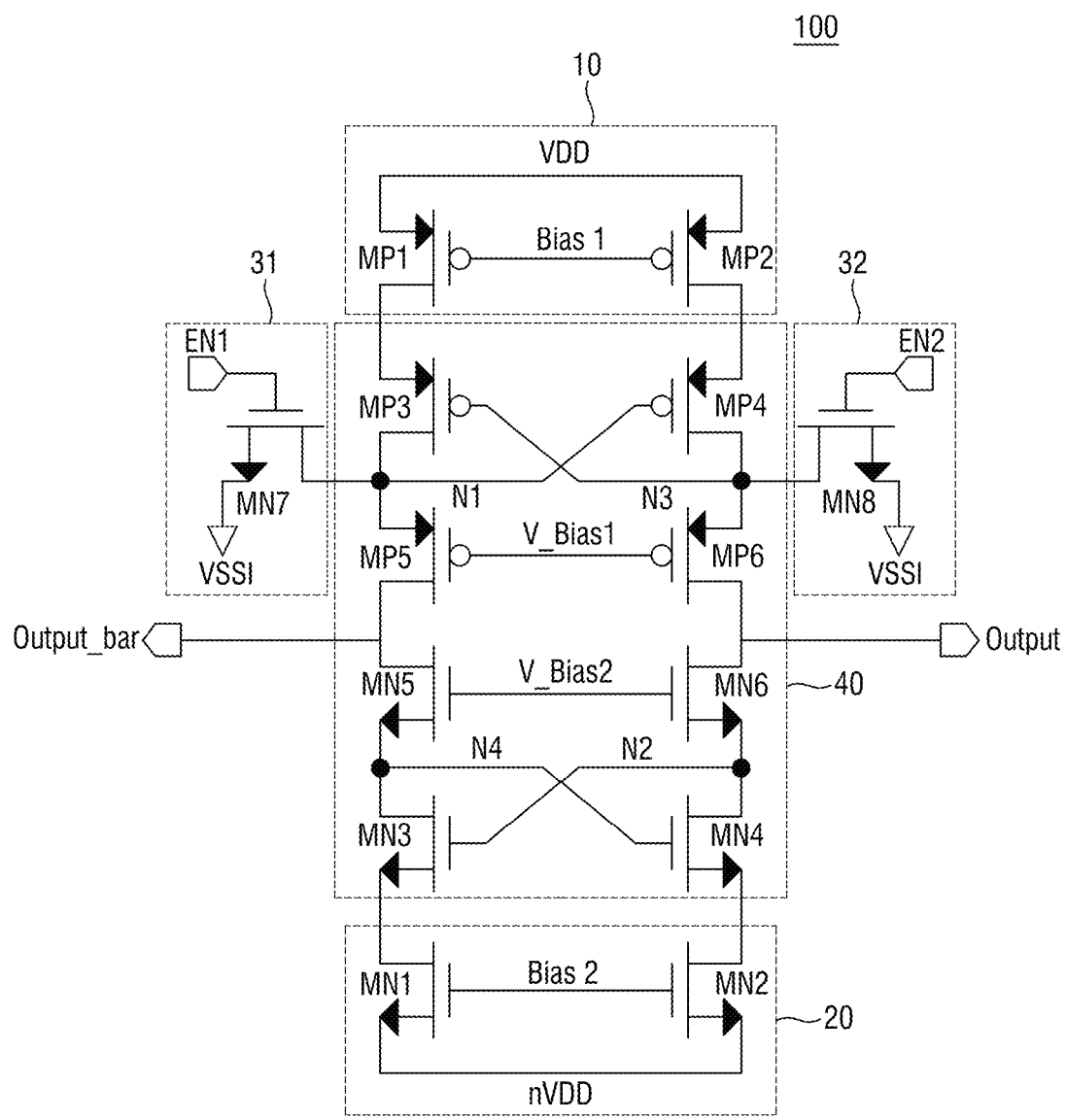
FIG. 1 is level shifter circuitry according to some example embodiments.

FIG. 1 is level shifter circuitry according to some example embodiments.

Referring to FIG. 1, the level shifter circuitry 100 may include a positive sub-circuit 10, a negative sub-circuit 20, enable circuits 31 and 32, and/or a shifting circuit 40.

The positive sub-circuit 10 may include an MP1 transistor and an MP2 transistor. One end of the MP1 transistor and one end of the MP2 transistor are each connected to the VDD power supply voltage, and a voltage by a first bias current Bias1 is applied to a gate. The transistors included in the positive sub-circuit 10 may be, for example, PMOS transistors.

The shifting circuit 40 may include a two-stage pull-up transistor structure and a two-stage pull-down transistor structure, according to some example embodiments. The two-stage pull-up transistor structure and the two-stage pull-down transistor structure of the shifting circuit 40 are connected by a cascode structure, and the facing pull-up transistors or the facing pull-down transistors may be connected to each other by a cross-coupled structure, while at least two cascode structures are connected in parallel.

For example, the shifting circuit 40 may include MP3 to MP6 transistors MP3, MP4, MP5, and MP6 and MN3 to MN6 transistors MN3, MN4, MN5, and MN6. For example, the MP3 to MP6 transistors may be PMOS transistors, and the MN3 to MN6 transistors may be NMOS transistors.

The MP3 transistor is connected between the other end of MP1 transistor and a N1 node, and the gate may be connected to a N3 node. The MP4 transistor is connected between the other end of the MP2 transistor and the N3 node, and the gate may be connected to the N1 node.

That is, the MP3 transistor and the MP4 transistor may be connected to each other by a cross-coupled structure.

The MP5 transistor is connected between the N1 node and an inverted output terminal Output_bar, and the gate may be connected to a V_BIAS1 power supply terminal. The MP6 transistor is connected between the N3 node and an output terminal Output, and the gate may be connected to the V_BIAS1 power supply terminal. The V_BIAS1 may be a lower voltage different from the system ground voltage GND according to some example embodiments.

The MN5 transistor is connected between the inverted output terminal Output_bar and a N4 node, and the gate may be connected to a V_BIAS2 power supply terminal. The MN6 transistor is connected between the output terminal Output and the N2 node, and the gate may be connected to the V_BIAS2 power supply terminal. The V_BIAS2 may have a power supply voltage different from VDD according to some example embodiments.

One end of the MN3 transistor is connected to the N4 node, and the gate may be connected to the N2 node. One end of the MN4 transistor is connected to the N2 node, and the gate may be connected to the N4 node. That is, the MN3 transistor and the MN4 transistor may be connected to each other by a cross-coupled structure.

The negative sub-circuit 20 may include an MN1 transistor and an MN2 transistor. The MN1 transistor may be connected to the other end of the MN3 transistor and an nVDD power supply terminal. The MN2 transistor may be connected to the other end of the MN4 transistor and the nVDD power supply terminal.

The enable circuits 31 and 32 each may be connected to one node on the pull-up transistor side. According to some example embodiments, the enable circuits 31 and 32 may be connected to the N1 and N3 nodes, respectively. The enable circuits 31 and 32 may include an MN7 transistor and an MN8 transistor. The enable signals EN1 and EN2 may be logic signals opposite to each other. For example, if the enable signal EN1 is low, the enable signal EN2 may be high. The transistors included in the enable circuits 31 and 32 may be, for example, NMOS transistors. Although the drawings show that enable circuits 31 and 32 according to some example embodiments of the present inventive concepts are connected to the N1 node and the N3 node, respectively, the present inventive concepts are not limited thereto, and for example, any one of the enable circuits 31 and 32 may be included.

One end of the MN7 transistor is connected to the N1 node, the other end thereof is connected to a VSSI input ground terminal, and the EN1 enable signal may be applied to the gate. One end of the MN8 transistor is connected to the N3 node, the other end thereof is connected to the VSSI input ground terminal, and the EN2 enable signal may be applied to the gate.

That is, the level shifter circuitry 100 may include a MP1 transistor, a MP3 transistor, a MP5 transistor, a MN5 transistor, a MN3 transistor, and/or a MN1 transistor connected in series between the VDD power supply terminal and the nVDD power supply terminal, and a MP2 transistor, a MP4 transistor, a MP6 transistor, a MN6 transistor, a MN4 transistor, and a MN2 transistor connected in series between the VDD power supply terminal and the nVDD power supply terminal. The MP3 transistor and the MP4 transistor may be connected with each other by a cross-coupled structure, and the MN3 transistor and the MN4 transistor may also be connected with each other by a cross-coupled structure.

Further, the level shifter circuitry 100 may further include enable circuits 31 and 32 connected to respective ones of the N1 node between the MP3 transistor and the MP5 transistor and the N3 node between the MP4 transistor and the MP6 transistor.

Figure 2A:
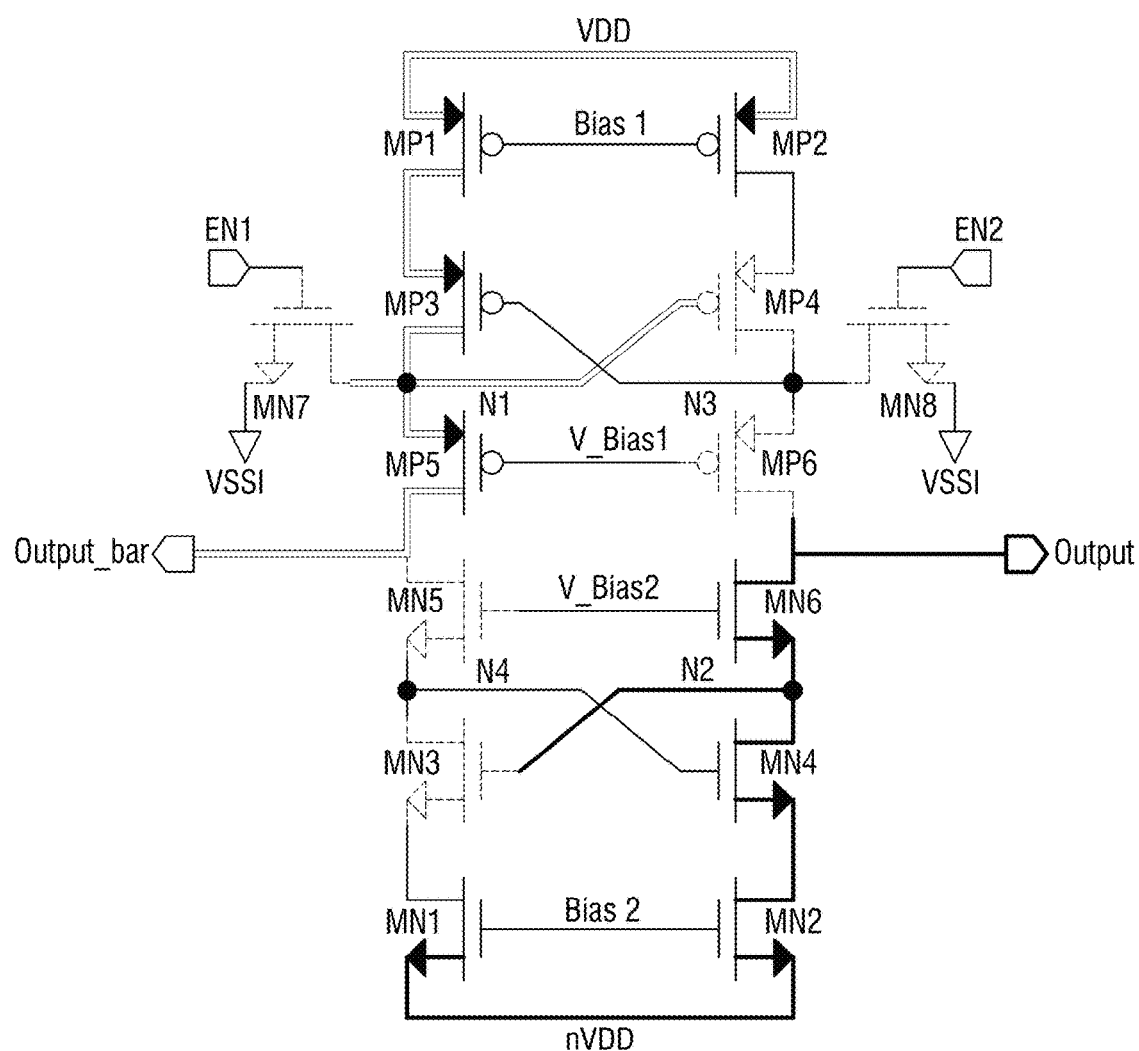
FIGS. 2A to 2D are circuit diagrams for explaining the operation of the level shifter circuitry of FIG. 1.
Figure 2B:
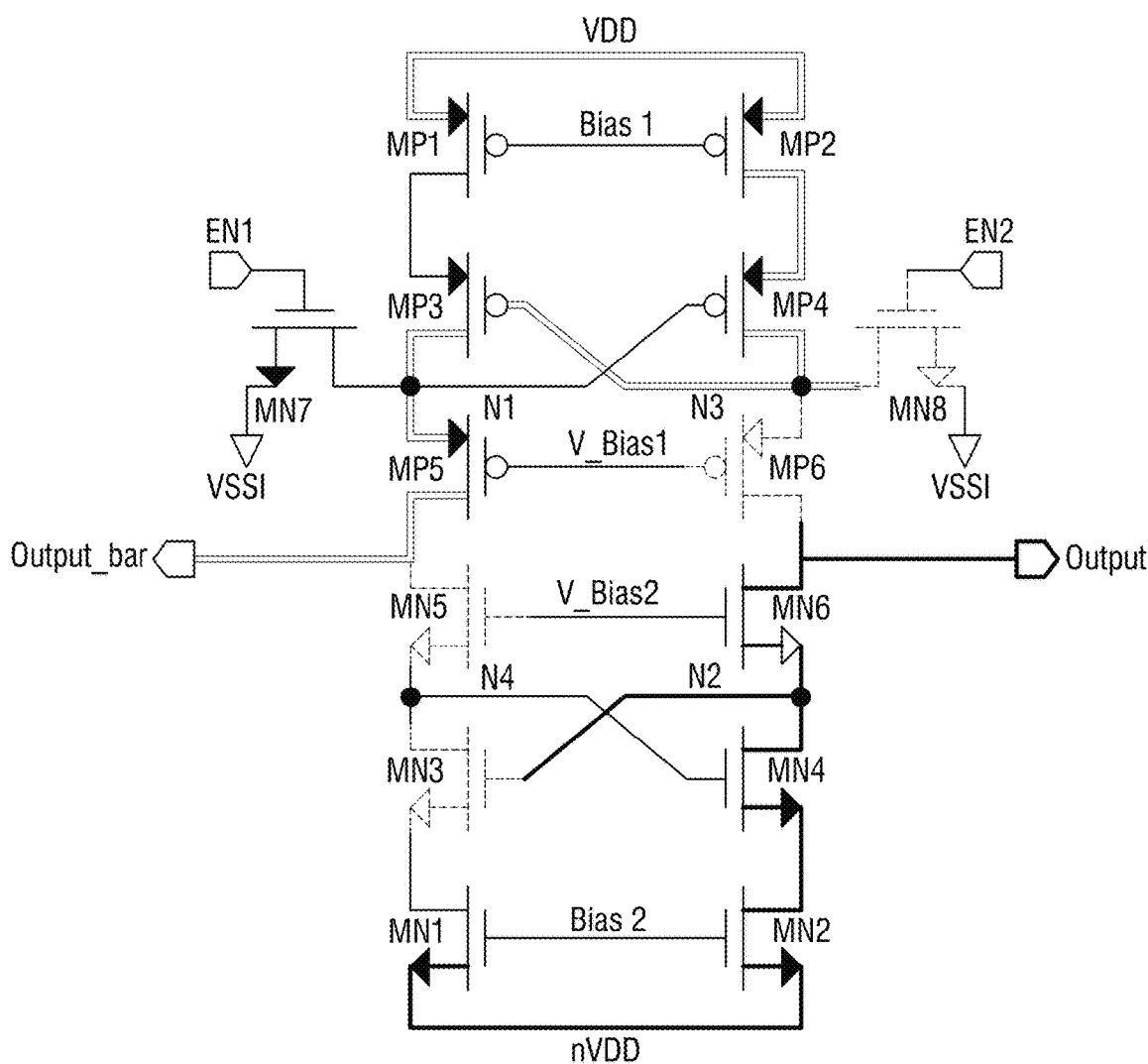
Figure 2C:
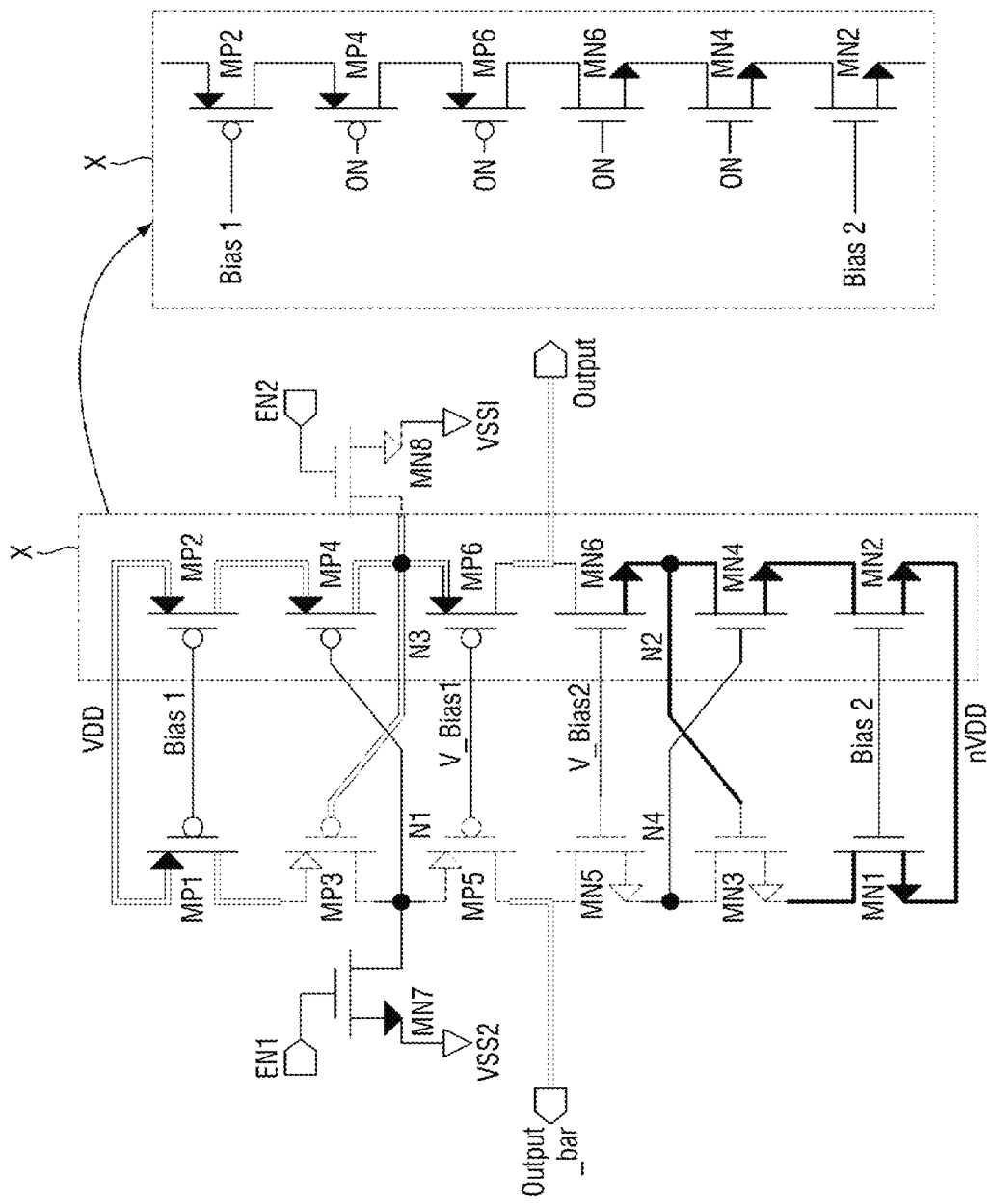
Figure 2D:
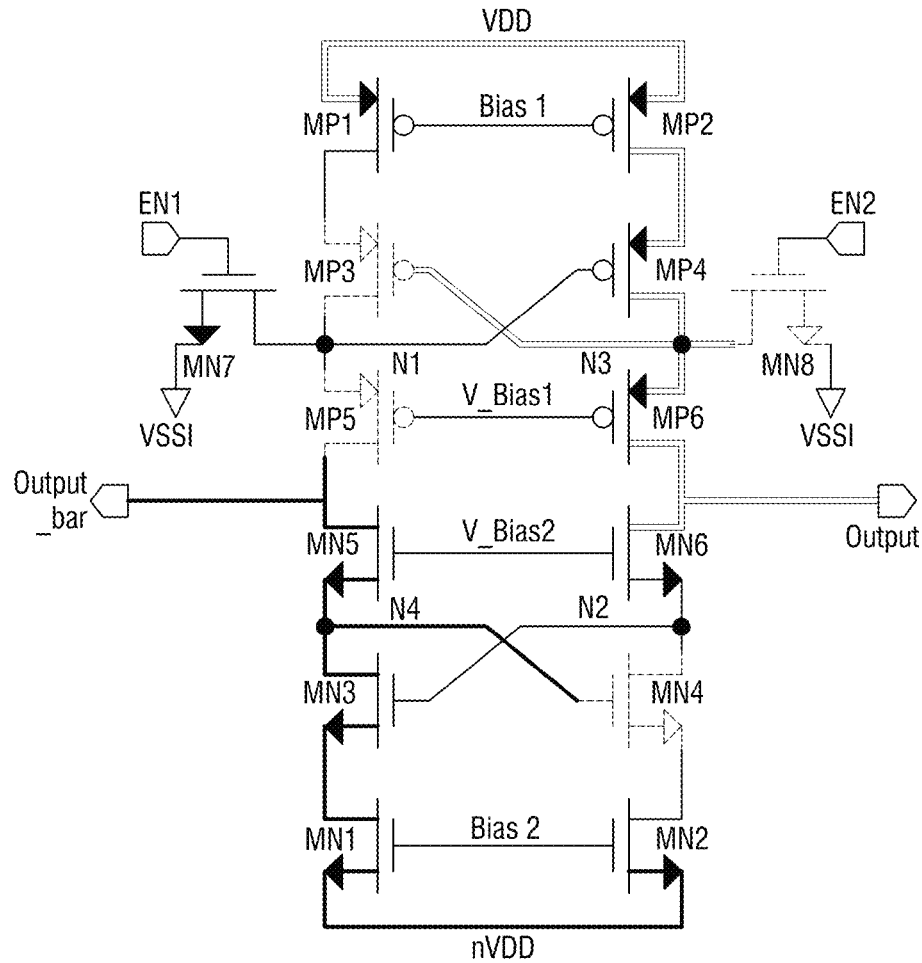
Figure 3:
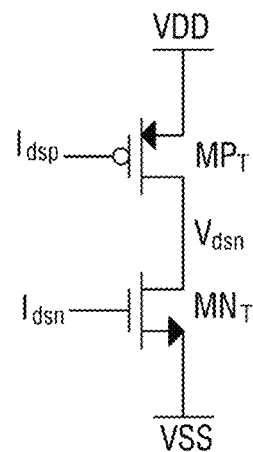
FIG. 3 is an equivalent circuit in the operation of the level shifter circuitry of FIG. 1.

FIGS. 2A to 2D are circuit diagrams for explaining the operation of the level shifter circuitry of FIG. 1, and FIG. 3 is an equivalent circuit in the operation of the level shifter circuitry of FIG. 1.

For convenience of explanation, the turned-off transistor is shown by a dotted line, and a double line (=) and a thick line (−) are each shown for explaining the flow of the input signal.

For convenience of explanation, although it is assumed that the power supply voltage VDD is 3.6V, nVDD is −1.8V, V_Bias2 is 1.8V, V_Bias1 is 0V, bias Bias1 is 6 μA, bias Bias2 is 4 μA, and a threshold voltage Vth of each transistor is assumed to be 0.4V, some example embodiments of the present inventive concepts are not limited thereto, and the range of input voltage or input bias may vary depending on various example embodiments. For example, nVDD may have negative voltage or positive voltage of different ranges, depending on various example embodiments, and the threshold voltages of each transistor may have different values depending on the design.

The bias Bias1 and the bias Bias2 are biases which are supplied to the gates of the MP1, MP2, MN1 and MN2 transistors on the basis of a current source that supplies a constant current bias to be described later. The V_Bias1 and V_Bias2 are voltage biases which are supplied to the gates of the MP5, MP6, MN5, and MN6 transistors on the basis of a constant voltage bias.

Referring to FIG. 2A, if low is applied to the enable signal EN1, the MN7 transistor is turned off. If high is applied to the enable signal EN2, the MN8 transistor is turned on. The MP1 and MP2 transistors are always turned on by the bias Bias1.

Since the MP4 and MP6 transistors connected to the N3 node are turned off, the N3 node becomes low. Since the MP5 transistor connected to the N1 node is turned on according to the V_BIAS1 signal, it becomes high. The MP4 transistor is turned off according to the signal of the N1 node. That is, the current is level-shifted while the VDD power supply voltage flows through the transistor MP1, the transistor MP3, and the transistor MP5, and 3.6V is output to the inverted output terminal Output_bar.

On the other hand, the MN1 transistor and the MN2 transistor are always turned on by the bias Bias2. The N4 node becomes high through the inverted output terminal Output_bar and the MN5 transistor, and the MN4 transistor is turned on. The N2 node becomes low because the MN4 and MN6 transistors are turned on. The MN3 and MN5 transistors are turned off. That is, the current is level-shifted while the nVDD supply voltage flows through the MN2, MN4, and MN6 transistors, and −1.8V is output to the output terminal Output.

Referring to FIG. 2B, some example embodiments are shown in which a lower supply voltage (e.g., 0.6V instead of 1V) close to the threshold voltage (0.7V) of the MN7 transistor is input to the enable signal EN1, and low is input to the enable signal EN2. FIG. 2B differs from FIG. 2A in that the MP3 and MP4 transistors are turned on.

In some example embodiments, the current is level-shifted while the VDD power supply voltage flows through the MP1 transistor, the MP3 transistor, and the MP5 transistor, and 3.6V is output to the inverted output terminal Output_bar.

On the other hand, on the opposite side, even if the MP4 transistor is turned on, since the MP6 transistor is turned off, the current is level-shifted, while nVDD supply voltage flows through the MN2, MN4, and MN6 transistors without being affected by the pull-up circuit, and −1.8V is output to the output terminal Output.

FIG. 2C shows that a level change is induced after level shifting of FIG. 2B.

In some example embodiments where the MP2 transistor, the MP4 transistor, the MP6 transistor, the MN6 transistor, the MN4 transistor and the MN2 transistor X are all turned on while the level shifter circuitry performs level shifting. As shown, if all the transistors indicated by X are turned on, that is, if both the pull-up transistor and the pull-down transistor are connected, they operate as shown in the equivalent circuit of FIG. 3. In some example embodiments, the bias Bias1 is $I_{dsp}$ and supplied as NIA, and the bias Bias2 is $I_{dsn}$ and supplied as 4 μA.

In some example embodiments, it is assumed that the VDD of the equivalent circuit is the VDD power supply voltage of the sub-circuit shown in FIG. 1 and may be 3.6V, the VSS of the equivalent circuit may be 0V similar to the VSSI shown in FIG. 1, while the enable circuit is supplied with 8 μA, the enable signal is 0.65V, the bias Bias1 supplied to the gates of the MP1 and MP2 transistors is NIA, and the bias Bias2 supplied to the gates of the MN1 and MN2 transistors is 4 μA. Such an assumption is merely an example for explaining the operation of the level shifter circuitry shown in FIG. 1, is not limited to the above-described voltages or current, and may be voltages or currents of different ranges according to various example embodiments.

In the aforementioned assumption, when explained on the basis of FIG. 3, a $MN_T$ transistor of the equivalent circuit is saturated, and a drain-source resistance $R_{dsn\_sat}$ of the $MN_T$ transistor may be described as Equation (1).

$$R_{dsn\_sat} = \left.\frac{V_{dsn}}{I_{dsn\_sat}}\right|_{I_{dsn}<I_{dsp}} \qquad \text{Equation (1)}$$

On the other hand, the $MP_T$ transistor operates in a triode region. If the drain-source current $I_{dsp}$ of the $MP_T$ transistor is described as a formula of voltage $V_{ds}$, the drain-source resistance $R_{dsp\_tri}$ of the $MP_T$ transistor is represented by the following Equation (2).

$$R_{dsp\_tri} = \frac{V_{ds}}{\frac{1}{2}u_p C_{ox}\frac{W}{l}(V_{gs}-V_{th})V_{ds}} = \left.\frac{1}{\frac{I_{dsp\_sat}}{(V_{gs}-V_{th})}} = \frac{(V_{gsp}-V_{thp})}{I_{dsp\_sat}}\right|_{I_{dsn}<I_{dsp}} \qquad \text{Equation (2)}$$

That is, if the output voltage $V_{dsn}$ is arranged on the basis of the power supply voltage VDD and the ground voltage VSS in consideration of both the drain-source resistance $R_{dsp\_tri}$ of the $MP_T$ transistor and the drain-source resistance $R_{dsn\_sat}$ of the $MN_T$ transistor, a swing range of the output voltage $V_{dsn}$ may be arranged as in Equation (3). In Equation (3), $V_{gsp}$ is the gate-source voltage of the $MP_T$ transistor, $V_{thp}$ is a threshold voltage of the $MP_T$ transistor, and ΔV is (VDD−VSS).

$$V_{dsn} = \frac{R_{dsn\_sat}*(VDD-VSS)}{R_{dsn\_sat}+R_{dsp\_tri}} = \frac{\frac{V_{dsn}}{I_{dsn\_sat}}*\Delta V}{\frac{V_{dsn}}{I_{dsn\_sat}}+\frac{V_{gsp}-V_{thp}}{I_{dsp\_sat}}} \qquad \text{Equation (3)}$$

If Equation (3) is arranged as Formula of the drain-source current $I_{dsp}$ of the $MP_T$ transistor and the drain-source current $I_{dsn}$ of the $MN_T$ transistor, Equation (4) and Equation (5) may be arranged.

$$V_{dsn} = \frac{\frac{V_{dsn} * \Delta V}{I_{dsn}}}{\frac{V_{dsn} * I_{dsp} + (V_{gs} - V_{th}) * I_{dsn}}{I_{dsn} * I_{dsp}}} = \quad \text{Equation (4)}$$

$$\frac{V_{dsn} * \Delta V * I_{dsn} * I_{dsp}}{V_{dsn} * I_{dsp} * I_{dsn} + (V_{gs} - V_{th}) * I_{dsn}^2}$$

$$1 = \frac{\Delta V * I_{dsp}}{V_{dsn} * I_{dsp} + (V_{gs} - V_{th}) * I_{dsn}} \Rightarrow V_{dsn} = \quad \text{Equation (5)}$$

$$\Delta V * \frac{I_{dsp}}{I_{dsp}} - (V_{gs} - V_{th}) * \frac{I_{dsn}}{I_{dsp}}$$

Assuming that VSS is 0V, it may be rearranged as in Equation (6).

$$V_{dsn} = (VDD - VSS) - (V_{gsp} - V_{thp}) * \frac{I_{dsn}}{I_{dsp}}\bigg|_{I_{dsn} < I_{dsp}} \quad \text{Equation (6)}$$

If values are substituted into each of VDD, $V_{gsp}$, $V_{thp}$, $I_{dsn}$, and $I_{dsp}$ according to the aforementioned assumption, since $V_{dsn}$ is 3.6−(0.65−0.4)*(4μ/6μ) and becomes about 3.6V, it can be understood that even if the enable signal, e.g., the input signal, has a lower supply voltage (0.65V), the output voltage (Output) is sufficiently level-shifted to a required level (3.6V).

On the other hand, when the $MP_T$ transistor of the equivalent circuit is saturated and the $MN_T$ transistor operates in a triode region, it may be arranged as in Equation (7).

$$V_{ds} = VSS + (V_{gsn} - V_{thn}) * \frac{I_{dsp}}{I_{dsn}}\bigg|_{I_{dsn} > I_{dsp}} \quad \text{Equation (7)}$$

Also in the case of Equation (7), it can be understood that even if a lower supply voltage is input, the output voltage is sufficiently level-shifted.

Referring to FIG. 2D, according to some example embodiments, the MP3 transistor, the MP5 transistor, and the MN4 transistor may be turned off after the output voltage is level-shifted.

In some example embodiments, a voltage of −1.8V may be output from the nVDD supply voltage to the inverted output terminal Output bar via the MN1, MN3, and MN5 transistors. On the other side, since the current flows from the VDD power supply voltage via the MP2 transistor, the MP4 transistor, and the MP6 transistor, 3.6V may be output to the output terminal (Output).

Figure 4:
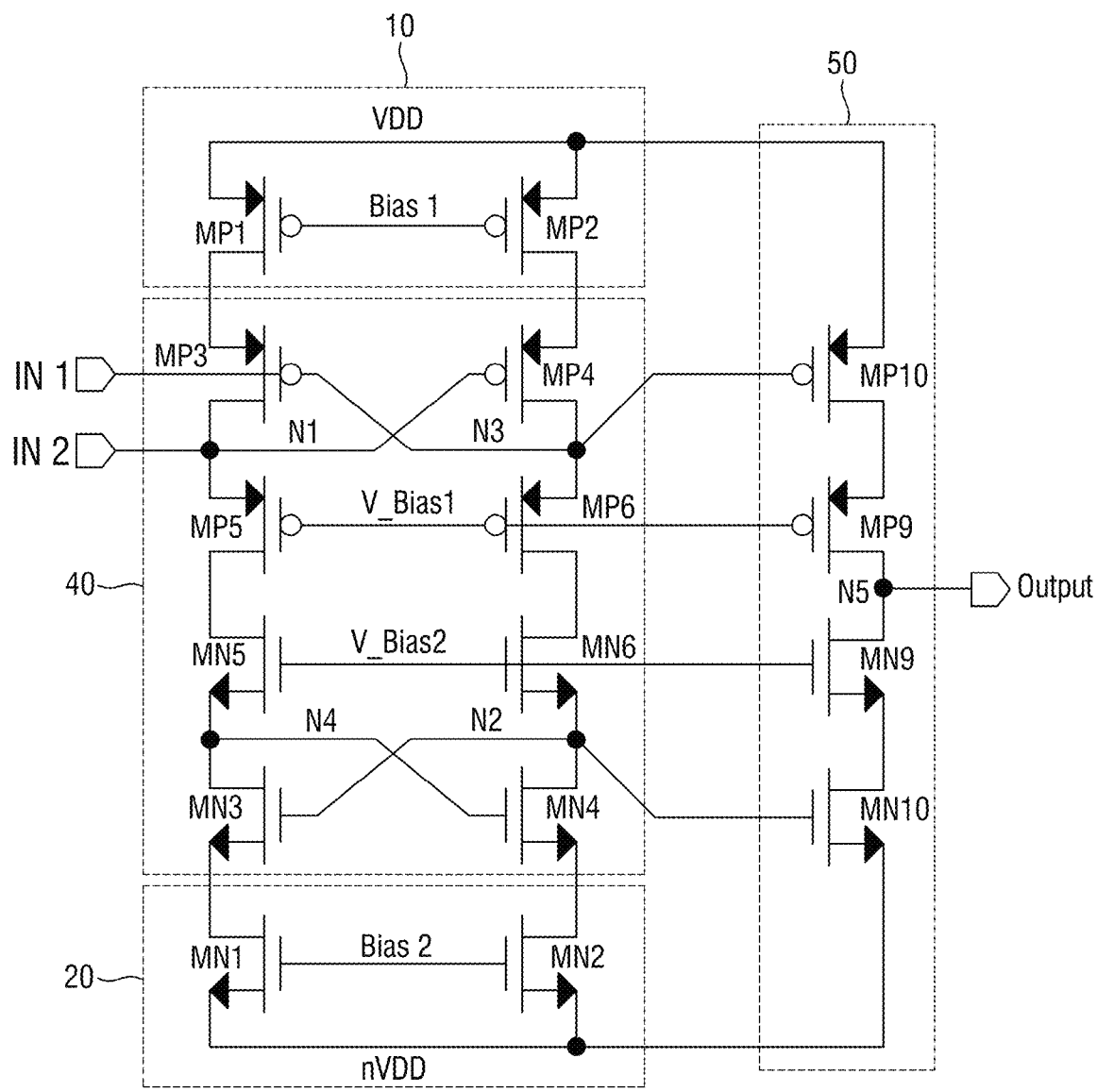
FIG. 4 is level shifter circuitry according to some example embodiments.

FIG. 4 is level shifter circuitry according to some example embodiments.

Referring to FIG. 4, the level shifter circuitry 100 may further include a driving circuit 50. For convenience of explanation, description of the same configuration as that of FIG. 1 will be omitted.

The level shifter circuitry 100 may further include a positive sub-circuit 10, a negative sub-circuit 20, a shifting circuit 40 and/or a driving circuit 50.

In the shifting circuit 40, the input signal IN1 may be applied to the N3 node, and the input signal IN2 may be applied to the N1 node. The input signal IN1 and the input signal IN2 are signals for turning on or off the MP3 transistor and the MP4 transistor so that the level shifter circuitry performs the level shifting operation. Since the operations of the sub-circuits 10 and 20 and the shifting circuit 40 are the same as those explained in FIGS. 2A to 2D, a detailed description thereof will not be provided. In the driving circuit 50, the voltage level of the output signal (Output) may swing according to the driving of the pull-up driver or the pull-down driver.

The driving circuit 50 may include a pull-up driver in which the MP10 transistor and the MP9 transistor are connected by a cascode structure, and a pull-down driver in which the MN9 transistor and the MN10 transistor are connected by a cascode structure. The driving circuit 50 according to some example embodiments may include an MP10 transistor and an MP9 transistor connected in series between the VDD power supply terminal and the N5 node, and an MN9 transistor and an MN10 transistor connected in series between the N5 node and the nVDD power supply terminal. The MP9 transistor and the MP10 transistor may be, for example, PMOS transistors, and the MN9 transistor and the MN10 transistor may be, for example, NMOS transistors.

The N3 node may be connected to the gate of the MP10 transistor, and the V_BIAS1 power supply terminal may be connected to the gate of the MP9 transistor. The V_BIAS2 power supply terminal may be connected to the gate of the MN9 transistor, and the N2 node may be connected to the gate of the MN10 transistor.

Figure 5:
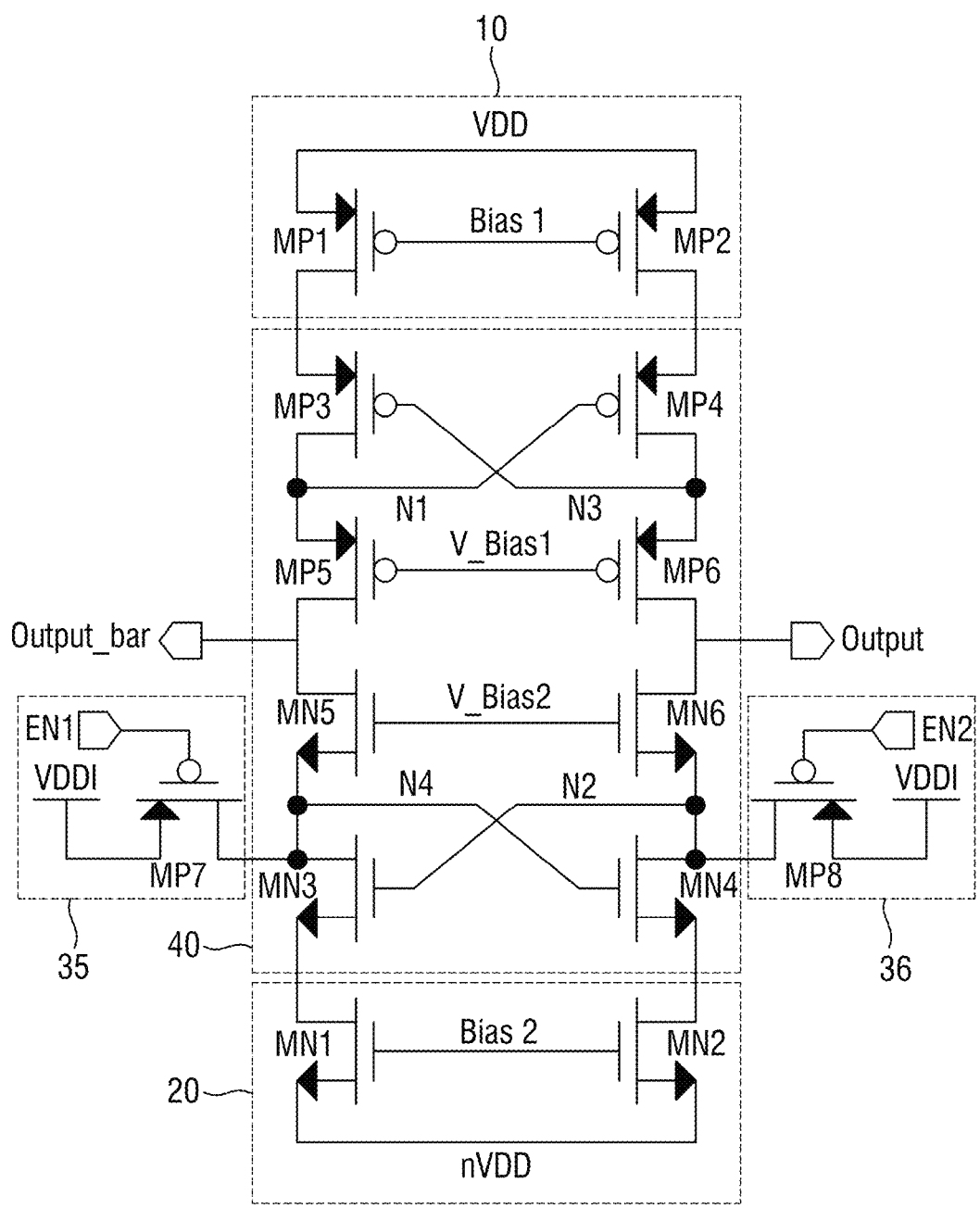
FIG. 5 is level shifter circuitry according to some example embodiments.

FIG. 5 is level shifter circuitry according to some example embodiments.

Referring to FIG. 5, the level shifter circuitry 100 may include sub-circuits 10 and 20, enable circuits 35 and 36, and/or a shifting circuit 40. Repeated explanation of the aforementioned contents in relation to the configurations and operations of the sub-circuits 10 and 20 and the shifting circuit 40 will not be provided.

The enable circuits 35 and 36 may be connected to one node on the pull-down transistor side. The enable circuits 35 and 36 according to some example embodiments may be connected to the N2 node and the N4 node, respectively. The enable circuits 35 and 36 may include an MP7 transistor and an MP8 transistor. The MP7 transistor and the MP8 transistor may be, for example, PMOS transistors.

In the enable circuits 35 and 36, the MP7 transistor has one end connected to the N4 node and the other end connected to the VDDI power supply terminal, and the EN1 enable signal may be applied to the gate. One end of the MP8 transistor is connected to the N2 node, the other end thereof is connected to the VDDI power supply terminal, and an EN2 enable signal may be applied to the gate.

Although the drawings show that the enable circuits 35 and 36 according to some example embodiments of the present inventive concepts are connected to the N2 node and the N4 node, respectively, the present inventive concepts are not limited thereto. For example, any one of the enable circuits 35 and 36 may be included.

Figure 6:
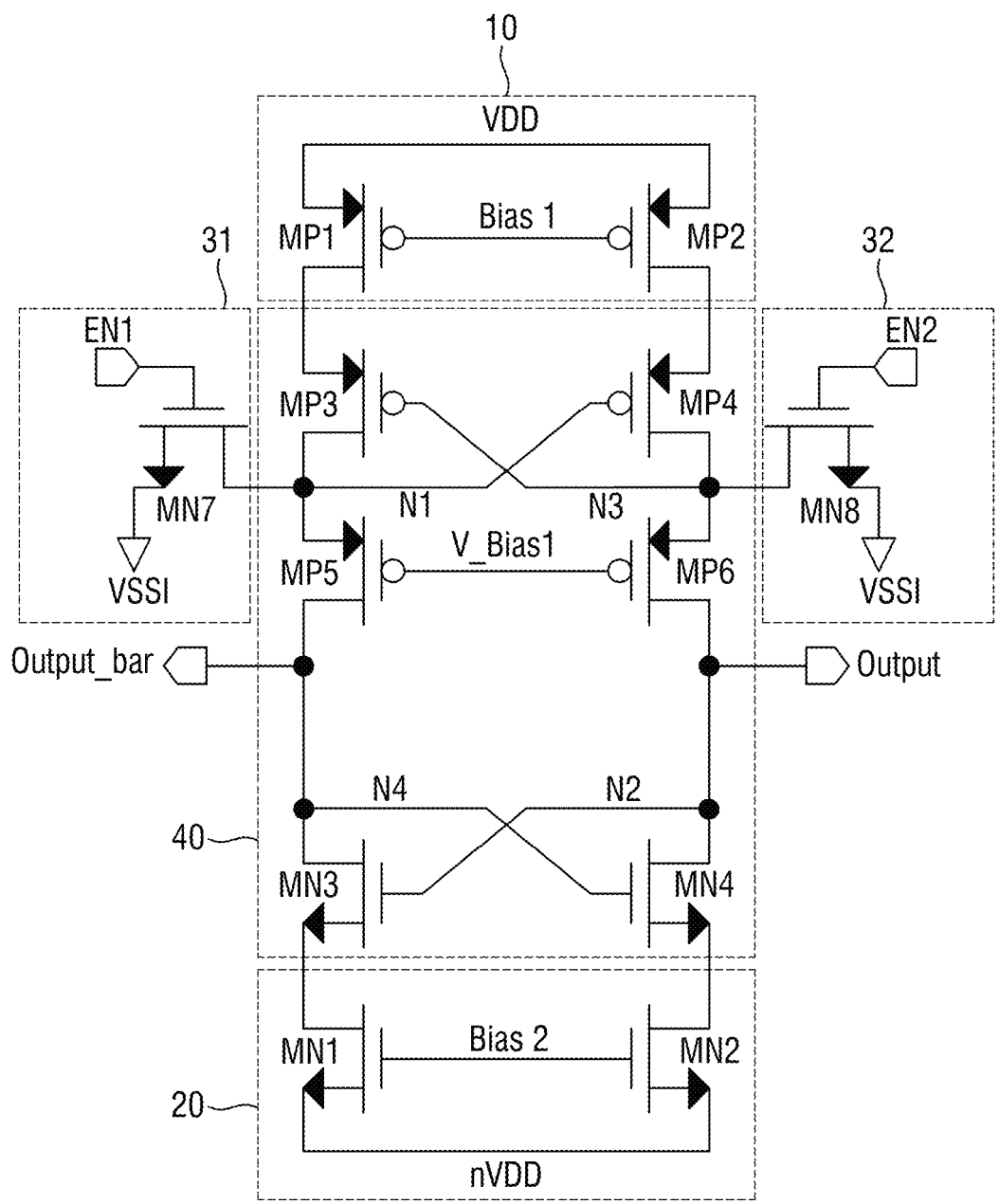
FIG. 6 is level shifter circuitry according to some example embodiments.

FIG. 6 is level shifter circuitry according to some example embodiments.

Referring to FIG. 6, the level shifter circuitry 100 may include sub-circuits 10 and 20, enable circuits 31 and 32, and/or a shifting circuit 40. Repeated explanation of the aforementioned contents in relation to the configurations and operations of the sub-circuits 10 and 20 and the enable circuits 31 and 32 will not be provided.

The shifting circuit 40 according to some example embodiments may be made up of a two-stage pull-up transistor and a single-stage pull-down transistor. The two-stage pull-up transistor and the single-stage pull-down transistor of the shifting circuit 40 are connected by a cascode structure, and the facing pull-up transistors or the facing pull-down transistors may be connected to each other by a cross-coupled structure, while at least two cascode structures are connected in parallel. According to some example embodiments, the shifting circuit 40 may include MP3 to MP6 transistors, the MN3 transistor and the MN4 transistor.

The MP3 transistor is connected between the other end of the MP1 transistor and the N1 node, and the gate may be connected to the N3 node. The MP4 transistor is connected between the other end of the MP2 transistor and the N3 node, and the gate may be connected to the N1 node. That is, the MP3 transistor and the MP4 transistor may be connected to each other by a cross-coupled structure. The MP5 transistor is connected between the N1 node and the inverted output terminal Output bar, that is, the N4 node, and the gate may be connected to the V_BIAS1 supply terminal. The MP6 transistor is connected between the N3 node and an output terminal (Output), that is, the N2 node, and the gate may be connected to the V_BIAS1 supply terminal.

The MN3 transistor is connected between the N4 node and one end (drain terminal) of the MN1 transistor, and the gate may be connected to the N2 node. The MN4 transistor is connected between the N2 node and one end (drain terminal) of the MN2 transistor, and the gate may be connected to the N4 node. That is, the MN3 transistor and the MN4 transistor may be connected to each other by a cross-coupled structure.

Figure 7:
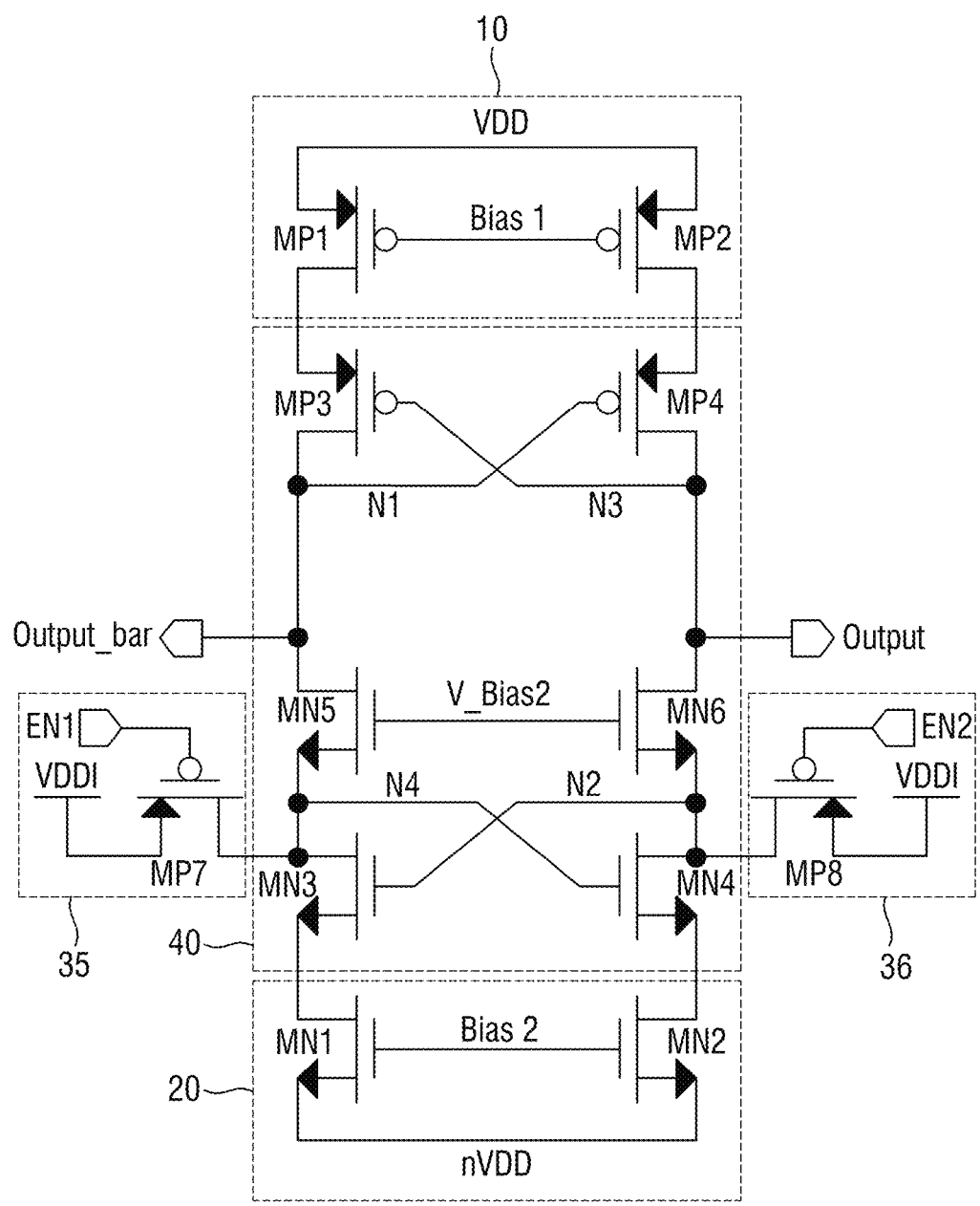
FIG. 7 is level shifter circuitry according to some example embodiments.

FIG. 7 is level shifter circuitry according to some example embodiments.

Referring to FIG. 7, the level shifter circuitry 100 may include sub-circuits 10 and 20, enable circuits 35 and 36, and/or a shifting circuit 40. Repeated explanation of the aforementioned contents in relation to the configurations and operations of the sub-circuits 10 and 20 and the enable circuits 35 and 36 will not be provided.

The shifting circuit 40 according to some example embodiments may be made up of a single-stage pull-up transistor and a two-stage pull-down transistor. The single-stage pull-up transistor and the two-stage pull-down transistor of the shifting circuit 40 are connected by a cascode structure, and the facing pull-up transistors or the facing pull-down transistors may be connected to each other by a cross-coupled structure, while at least two cascode structures are connected in parallel. According to some example embodiments, the shifting circuit 40 may include an MP3 transistor, an MP4 transistor, and an MN3 transistor to an MN6 transistor.

The MP3 transistor is connected between the other end of the MP1 transistor and the N1 node, that is, the inverted output terminal Output_bar, and the gate may be connected to the N3 node. The MP4 transistor connected between the other end of the MP2 transistor and the N3 node, e.g., the output terminal (Output), and the gate may be connected to the N1 node. That is, the MP3 transistor and the MP4 transistor may be connected to each other by a cross-coupled structure.

The MN5 transistor is connected between the inverted output terminal Output_bar and the N4 node, and the gate may be connected to the V_BIAS2 supply terminal. The MN6 transistor is connected between the output terminal Output and the N2 node, and the gate may be connected to the V_BIAS2 supply terminal. The MN3 transistor is connected between the N4 node and one end (drain terminal) of the MN1 transistor, and the gate may be connected to the N2 node. The MN4 transistor is connected between the N2 node and the one end (drain terminal) of the MN2 transistor, and the gate may be connected to the N4 node. That is, the MN3 transistor and the MN4 transistor may be connected to each other by a cross-coupled structure.

Figure 8:
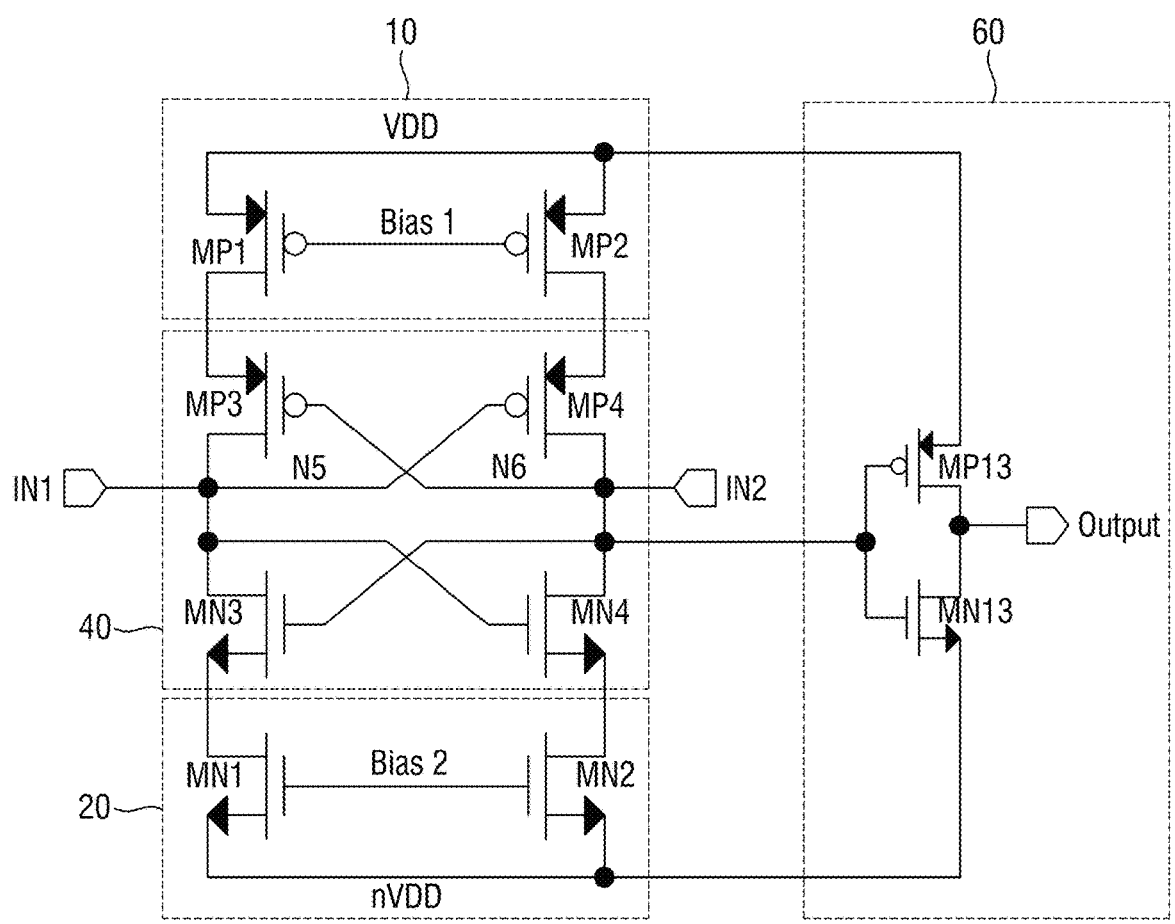
FIG. 8 is level shifter circuitry according to some example embodiments.

FIG. 8 is level shifter circuitry according to some example embodiments.

Referring to FIG. 8, the level shifter circuitry 100 may include sub-circuits 10 and 20, a shifting circuit 40, and/or an inverter circuit 60. Repeated explanation of the aforementioned contents in relation to the configurations and operations of the sub-circuits 10 and 20 will not be provided.

The shifting circuit 40 according to some example embodiments may be made up of a single-stage pull-up transistor and a single-stage pull-down transistor. The single-stage pull-up transistor and the single-stage pull-down transistor of the shifting circuit 40 are connected by a cascode structure, and the facing pull-up transistors or the facing pull-down transistors may be connected to each other by a cross-coupled structure, while at least two cascode structures are connected in parallel. Alternatively, the shifting circuit 40 may be described as one in which two inverters are connected by a cross-coupled structure.

In the shifting circuit 40, the input signal IN1 may be input to the N5 node, the input signal IN2 may be input to the N6 node, and the pull-up transistor and the pull-down transistor may be connected to both ends of the node on the basis of the N5 node or the N6 node.

According to some example embodiments, the shifting circuit 40 may include an MP3 transistor, an MP4 transistor, an MN3 transistor, and an MN4 transistor. The MP3 transistor is connected between one end (drain terminal) of the MP1 transistor and the N5 node, and the N6 node may be connected to the gate. The MP4 transistor is connected between one end (drain terminal) of the MP2 transistor and the N6 node, and the N5 node may be connected to the gate. The MN3 transistor is connected between one end (drain terminal) of the MN1 transistor and the N5 node, and the N5 node may be connected to the gate. The MN4 transistor is connected to one end (drain terminal) of the MN2 transistor and the N6 node, and the N5 node may be connected to the gate.

The inverter circuit 60 may include an MP13 transistor and a MN13 transistor connected between a VDD power supply terminal and an nVDD power supply terminal by a cascode structure according to some example embodiments. The input of the inverter circuit 60, that is, the gates of the MP13 transistor and the MN13 transistor may be connected to the N6 node. An output of the inverter circuit 60, that is, one end (drain terminal) of the MP13 transistor and one end (drain terminal) of the MN13 transistor may be connected to the output terminal (Output). That is, the inverter circuit 60 inverts the signal of the N6 node and outputs the inverted signal to the output terminal Output.

Figure 9:
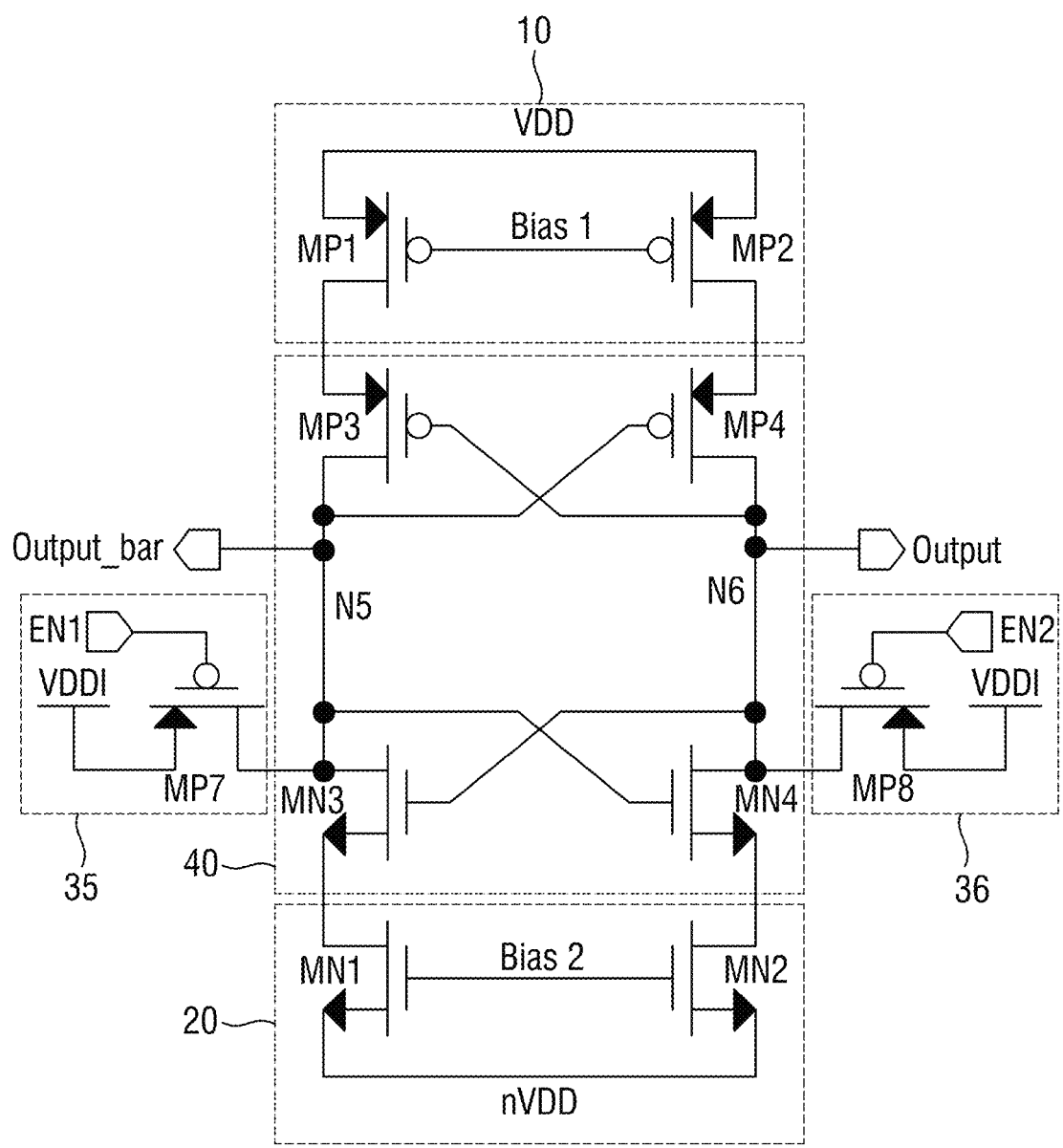
FIG. 9 is level shifter circuitry according to some example embodiments.

FIG. 9 is level shifter circuitry according to some example embodiments.

Referring to FIG. 9, the level shifter circuitry 100 may include sub-circuits 10 and 20, enable circuits 35 and 36, and/or a shifting circuit 40. Repeated explanation of the aforementioned contents in relation to the configurations and operations of the sub-circuits 10 and 20 and the enable circuits 35 and 36 will not be provided.

The shifting circuit 40 according to some example embodiments may be made up of a single-stage pull-up transistor and a single-stage pull-down transistor. The single-stage pull-up transistor and the single-stage pull-down transistor of the shifting circuit 40 are connected by a cascode structure, and the facing pull-up transistors or the facing pull-down transistors may be connected to each other by a cross-coupled structure, while at least two cascode structures are connected in parallel. Alternatively, the shifting circuit 40 may be described as one in which two inverters are connected to each other by a cross-coupled structure. In the shifting circuit 40, an enable circuit 35 is connected to the N5 node and an input signal may be received, and an enable circuit 36 is connected to the N6 node, and an input signal may be received. The pull-up transistor and the pull-down transistor of the shifting circuit 40 may be connected to both ends of the node on the basis of the N5 node or the N6 node. Since the remaining specific configurations of the shifting circuit 40 are the same as those described with reference to FIG. 8, explanation thereof will not be provided.

Figure 10:
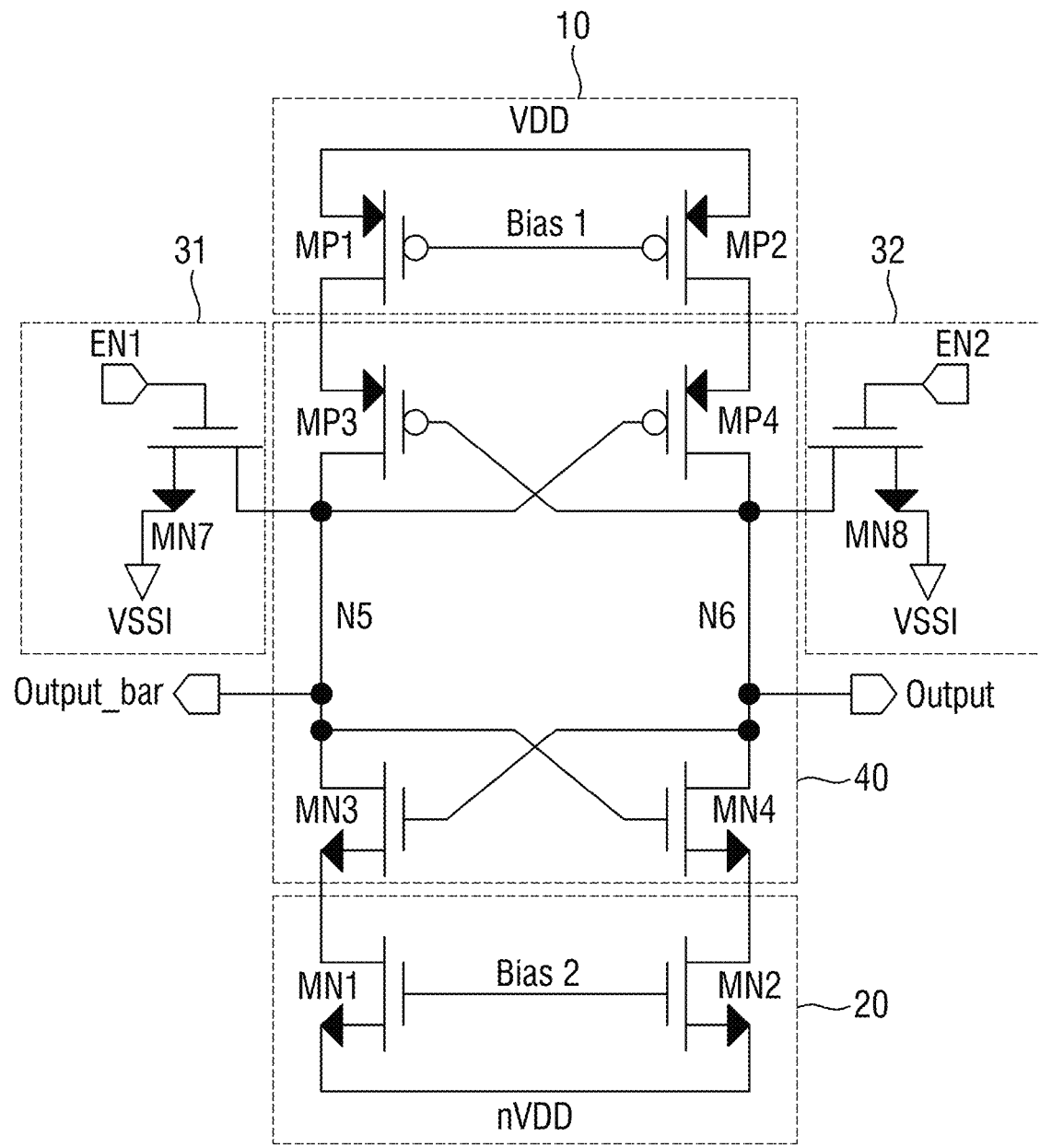
FIG. 10 is level shifter circuitry according to some example embodiments.

FIG. 10 is level shifter circuitry according to some example embodiments.

Referring to FIG. 10, the level shifter circuitry 100 may include sub-circuits 10 and 20, enable circuits 31 and 32, and/or a shifting circuit 40. Repeated explanation of the aforementioned contents in relation to the configurations and operations of the sub-circuits 10 and 20 and the enable circuits 31 and 32 will not be provided.

The shifting circuit 40 according to some example embodiments may be made up of a single-stage pull-up transistor and a single-stage pull-down transistor. The single-stage pull-up transistor and the single-stage pull-down transistor of the shifting circuit 40 are connected by a cascode structure, and the facing pull-up transistors or the facing pull-down transistors may be connected to each other by a cross-coupled structure, while at least two cascode structures are connected in parallel. Alternatively, the shifting circuit 40 may be described as one in which two inverters are connected to each other by a cross-coupled structure. In the shifting circuit 40, an enable circuit 31 may be connected to the N5 node to receive an input signal, and an enable circuit 32 may be connected to the N6 node to receive an input signal. The pull-up transistor and the pull-down transistor of the shifting circuit 40 may be connected to both ends of the node on the basis of the N5 node or the N6 node. Since the remaining specific configurations of the shifting circuit 40 are the same as those described in FIG. 8, explanation thereof will not be provided.

Figure 11:
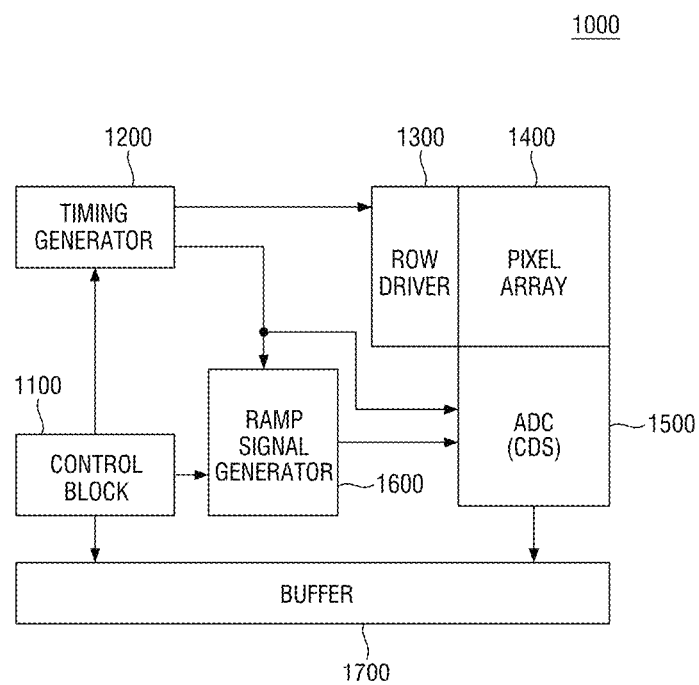
FIG. 11 is a block diagram of an image sensor including level shifter circuitry according to some example embodiments.
Figure 12:
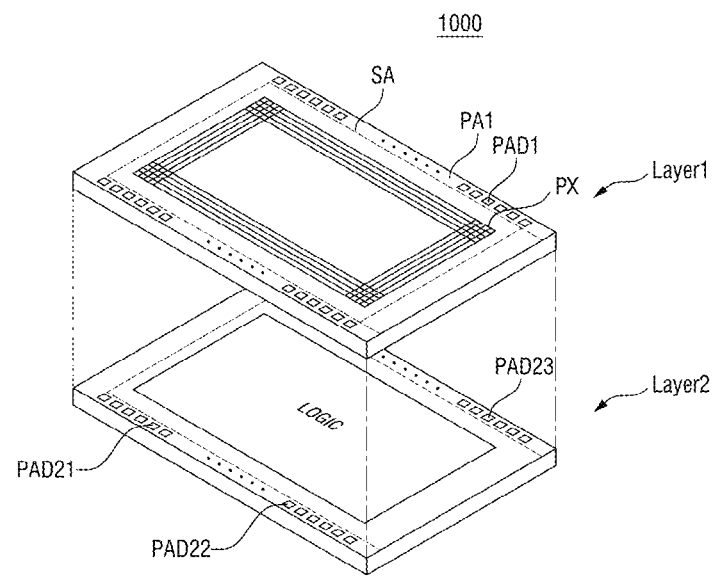
FIG. 12 is a layout of the image sensor shown in FIG. 11.
Figure 13:
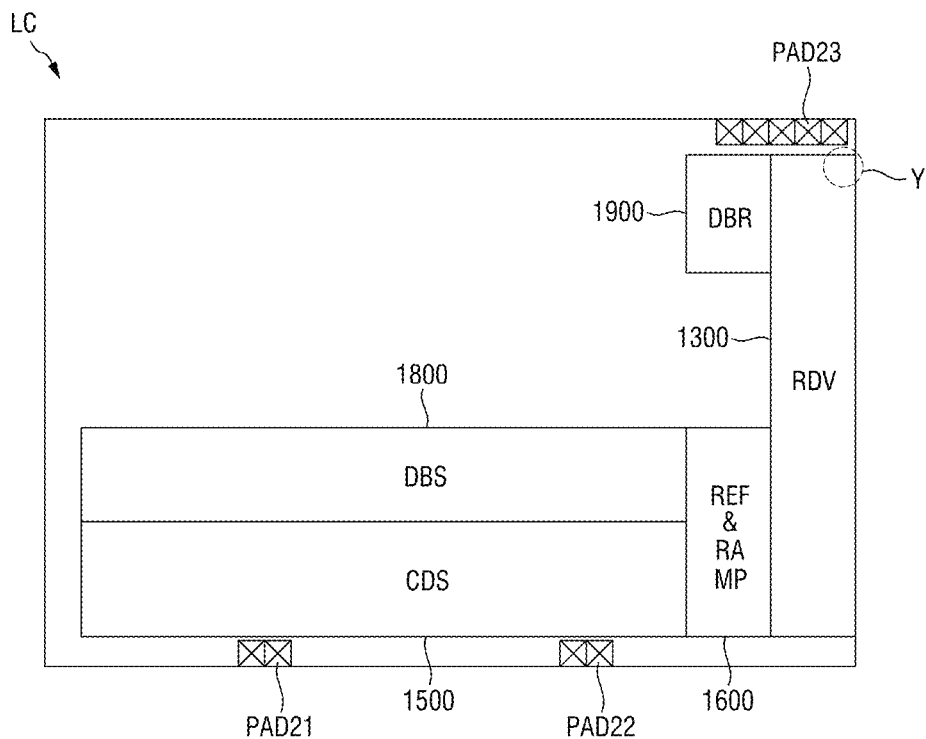
FIG. 13 is a layout of a logic circuit layer shown in FIG. 12.
Figure 14:
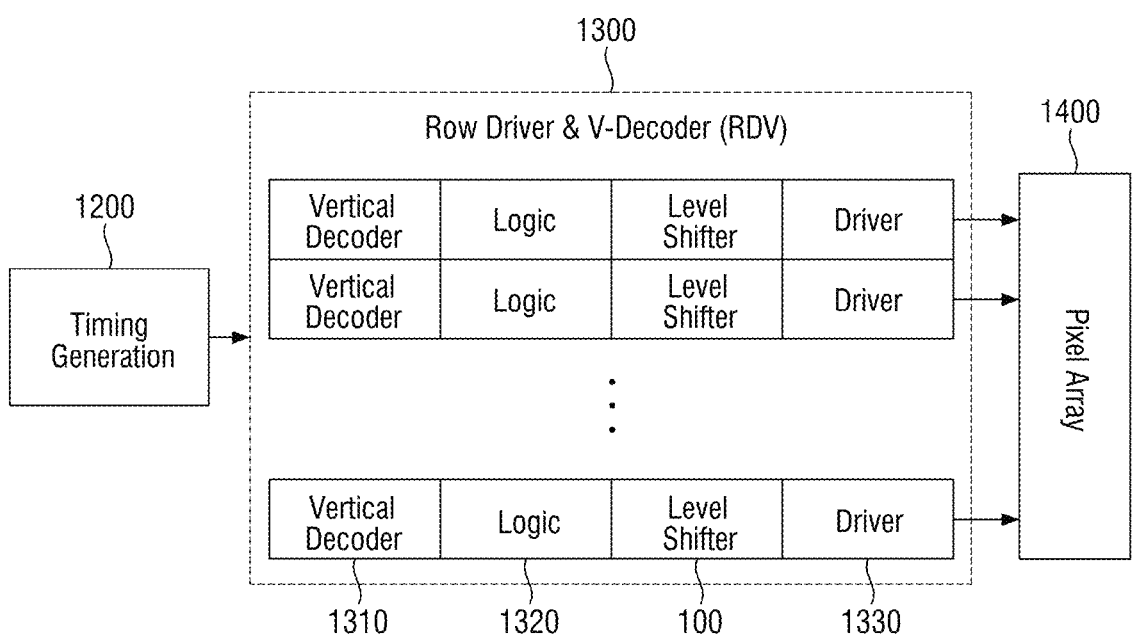
FIG. 14 and FIG. 15 is a block diagram showing the row driver of FIG. 13.

FIG. 11 is a block diagram of an image sensor including level shifter circuitry according to some example embodiments, FIG. 12 is a layout of the image sensor shown in FIG. 11, and FIG. 13 is a layout of a logic circuit layer shown in FIG. 12. FIG. 14 is a block diagram showing the row driver of FIG. 13.

Referring to FIG. 11, an image sensor 1000 may include a control register block 1100, a timing generator 1200, a row driver 1300, a pixel array 1400, an analog-to-digital converter 1500, a ramp signal generator 1600, and/or a buffer 1700, The control register block 1100 may entirely control the operation of the image sensor 1000. In particular, the control register block 1100 may directly transmit an operation signal to the timing generator 1200, the ramp signal generator 1600, and/or the buffer 1700.

The timing generator 1200 may generate a signal serving as a reference for operation timing of various constituent elements of the image sensor 1000. The operation timing reference signal generated by the timing generator 1200 may be transmitted to the row driver 1300, the analog-to-digital converter 1500, the ramp signal generator 1600, and/or the like.

The pixel array 1400 may sense an external image. The pixel array 1400 may include a plurality of pixels (or unit pixels). Each of the plurality of pixels PX may include a photoelectric element that receives light to generate electric charges, a pixel circuit that converts the electric charges generated by the photoelectric element into electric signals, and the like. The photoelectric element may include an organic photodiode or a semiconductor photodiode, and in some example embodiments, the organic photodiode and the semiconductor photodiode may be stacked on each other at each of a plurality of pixels PX. The pixel circuit may include a plurality of transistors for converting electric charges generated by the photoelectric element into electric signals.

The row driver 1300 may selectively activate a row of the pixel array 1400.

The analog-to-digital converter 1500 may sample the pixel signal provided from the pixel array 1400, compare it with the ramp signal, and then convert the analog image data into digital image data on the basis of the comparison result.

Although the drawings show that the analog-to-digital converter 1500 includes a correlated double sampler (CDS), a comparator, and the like, example embodiments are not limited thereto. If desired, the correlated double sampler (CDS), the comparator, and the like may be implemented as a logic circuit separated from the analog-to-digital converter 500.

The ramp signal generator 1600 may generate and transmit a ramp signal used for the analog-to-digital converter 1500. For example, the analog-to-digital converter 1500 may include a correlated double sampler (CDS), a comparator, and the like, and the ramp signal generator 1600 may generate and transmit a ramp signal used for the correlated double sampler (CDS), the comparator, and the like.

The buffer 1700 may include, for example, a latch unit. The buffer 1700 may temporarily store an image signal to be provided to the outside, and may transmit image data to an external memory or an external device.

Referring to FIG. 12, the image sensor 1000 may be implemented as a plurality of stacked layers. According to some example embodiments, the pixel array 1400 is implemented on a first layer (Layer 1), and the remaining configuration, e.g., the logic circuit may be implemented on a second layer (Layer 2). The logic circuit may include remaining constituent elements 1100, 1200, 1300, 1500, 1600, and/or 1700 other than the pixel array 1400 in the image sensor 1000 shown in FIG. 12. That is, the pixel array region and the logic circuit region may be stacked on each other at the wafer level.

The first layer (Layer 1) may include a sensing region SA including a plurality of pixels PX, and a first pad region PA1 provided around the sensing region SA. The first pad region PA1 includes a plurality of upper pads PAD1, and the plurality of upper pads PAD1 may be connected to pads PAD21 and PAD22 and logic circuit LOGIC provided in the second pad region PA2 of the second layer (Layer 2) through via or the like.

The pads PAD21 and PAD22 may be input interface pads, and the pad PAD23 may be an output interface pad, according to some example embodiments.

Referring to FIG. 13, on the second layer, the data bus (DBS) 1800, the analog-to-digital converter 1500, the ramp signal generator 1600 may be disposed to be adjacent to the pad regions PAD21 and PAD22 in the first direction. The row driver 1300 may be disposed between the pad regions PAD21, PAD22 and the pad region PAD23 in the second direction. Referring to FIG. 14, the row driver 1300 may include a vertical decoder 1310, logic 1320, level shifter circuitry 100, and/or a driver 1330.

The row driver 1300 may receive input of the operation timing reference signal generated by the timing generator 1200. The logic 1320 may provide the enable signals EN1 and EN2 to the level shift circuitry 100 depending on the result decoded by the vertical decoder 1310. The level shifter circuitry 100 is enabled by an enable signal and may output an output voltage. The level shifter circuitry 100 may include a shifting circuit, a source circuit, a sub-circuit, and/or an enable circuit in which the aforementioned two inverters are cross-coupled to output the target voltage. The driver 1330 may correct the voltage, which is output from the level shifter circuitry 100, and input the corrected voltage to the pixel array 1400.

That is, the row driver 1300 may include the level shifter circuitry in the form of an array. The level shifter circuitry may be included in an array of M (M is a natural number) in the first direction and N (N is a natural number greater than M) in the second direction, and in some example embodiments, as shown in FIGS. 14 and 15, the level shifter circuitry may be connected to a source circuit and disposed in the form of an array.

The power supply voltage which is input to the pads PAD21 and PAD22 is transmitted through the data bus 1800 and applied to the row driver 1300 via other constituent elements of the logic circuit. As it goes away from the power input terminals (e.g., PAD21 and PAD22) of the row driver 1300, for example, in the case of a Y point, as the transmission path of signal becomes longer, the level shifter circuitry 100 included in the row driver 1300 operates at a supply voltage lower than the input supply voltage. The level shifter circuitry 100 according to some example embodiments may operate with a lower supply voltage by further securing a supply voltage margin.

Figure 15:
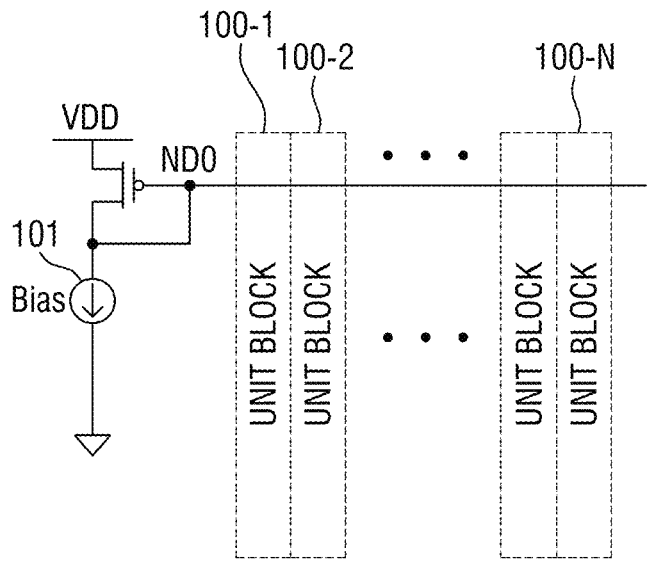

Referring to FIG. 15, the level shifter circuitry 100 may further include at least one or more source circuits. The plurality of level shifter circuitries 100-1 to 100-N may be connected to the source circuit. The source circuit may include a source transistor and a current source.

The source transistor may have one end connected to the system power supply voltage VDD or the input power supply voltage VDDI, and the other end and the gate connected to the source node ND0. The current source is connected to the source node ND0 and may supply a preset bias current Bias. For example, the bias current may be bias Bias 1 or bias Bias 2 shown in FIG. 1.

If the bias current Bias1 and the bias current Bias2 are different from each other according to some example embodiments, a plurality of source circuits may be implemented. The bias current Bias 1 supplied to the sub-circuit 10 of the level shifter circuitry 100 may be supplied from the first source circuit. The bias current Bias2 supplied to the sub-circuit 20 may be supplied from the second source circuit. The first source circuit and the second source circuit may be independent of each other. Although it is not shown, according to some example embodiments, the source circuit may further include at least one voltage source. The voltage source may supply the voltage bias V_Bias 1 or V_Bias 2 shown in FIG.

Figure 16A:
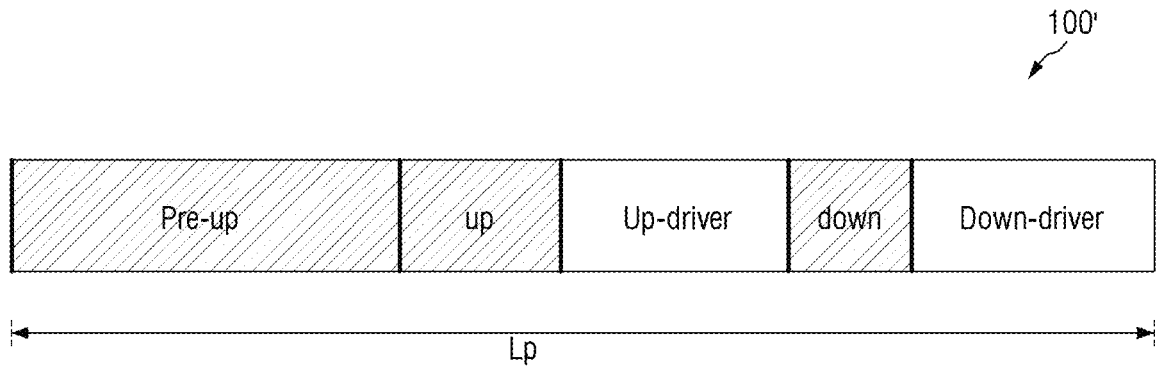
FIG. 16(*a*) is a layout of comparative level shifter circuitry and FIG. 16(*b*) is a layout of the level shifter circuitry included in FIG. 13.
Figure 16B:
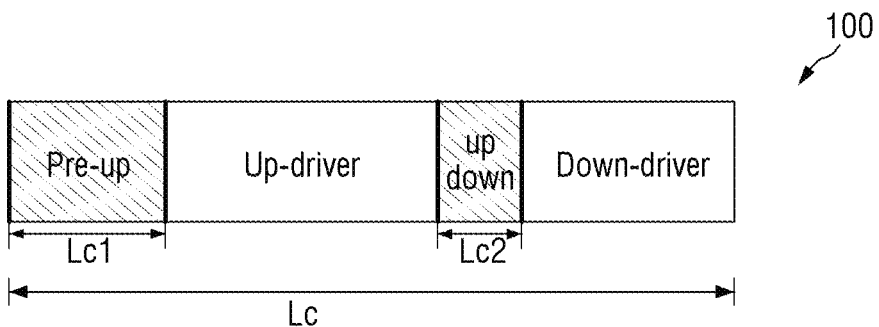

FIG. 16(b) is a layout of the level shifter circuitry included in FIG. 13.

Referring to FIG. 16(a), a level shifter circuitry 100' of a comparative example includes a pre-up circuit (Pre-Up), an up-circuit (Up), an up-driver circuit (Up-driver), a down-circuit (Down) and a down-driver circuit (Down-driver). The up-drive circuit and the down-driver circuit may be included in a driver 1330 of FIG. 14. Since the pre-up circuit (Pre-Up), the up-circuit (Up) and the down-circuit (Down) are required for pull-up and pull-down operations, the size of the level shifter circuitry of the comparative example is large.

However, in the level shifter circuitry 100 according to some example embodiments disclosed in the present specification and shown in FIG. 16(b), by reducing a size Lc1 of the pre-up circuit (Pre-Up) and a size Lc2 of the up-circuit (Up) and the down-circuit (Down) for the pull-up and pull-down operations, while sufficiently securing the supply voltage margin as shown in FIG. 16(b), there is an effect of reducing a layout design area.

Figure 17:
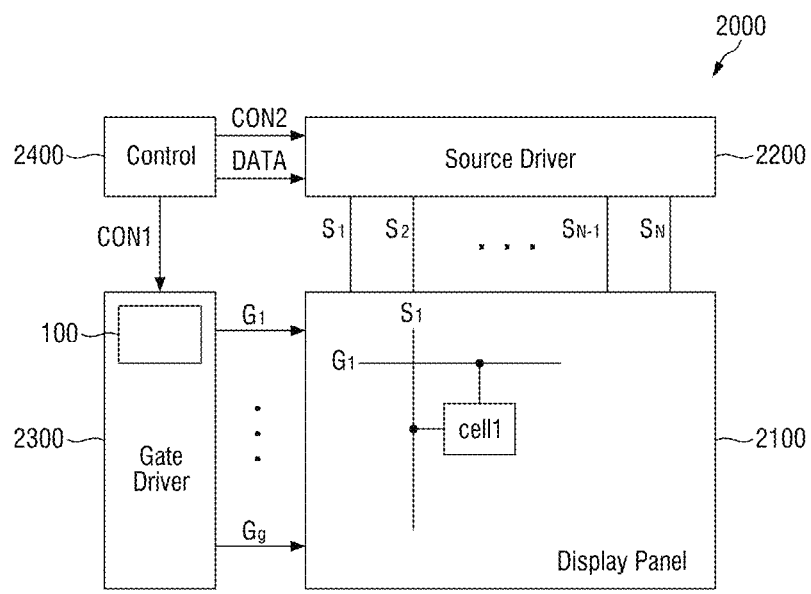
FIG. 17 is a block diagram of a display device including level shifter circuitry according to some example embodiments.

FIG. 17 is a block diagram of a display device including the level shifter circuitry according to some example embodiments.

Referring to FIG. 17, a display device 2000 includes a display panel 2100, a source driver 2200, a gate driver 2300, and/or a controller 2400.

The display panel 2100 includes a plurality of data lines 51 to SN, a plurality of gate lines G1 to Gg, and a plurality of pixels (Cell) connected between the plurality of data lines and the plurality of gate lines.

The source driver 2200 drives a plurality of data lines (or source lines) implemented on the display panel 2100 in response to control signals CON2 output from the controller 2400, and output data to the display panel 2100.

The gate driver 2300 sequentially drives a plurality of gate lines (or scan lines) implemented on the display panel 2100 so that the data output from the source driver 2200 may be supplied to a plurality of pixels, in response to the control signal CON1 output from the controller 2400. At this time, the gate driver 2300 may include level shifter circuitry 100 according to some example embodiments of the present inventive concepts, and may perform level-shifting of the driving voltage for driving the gate line in response to the control signals CON1.

Figure 18:
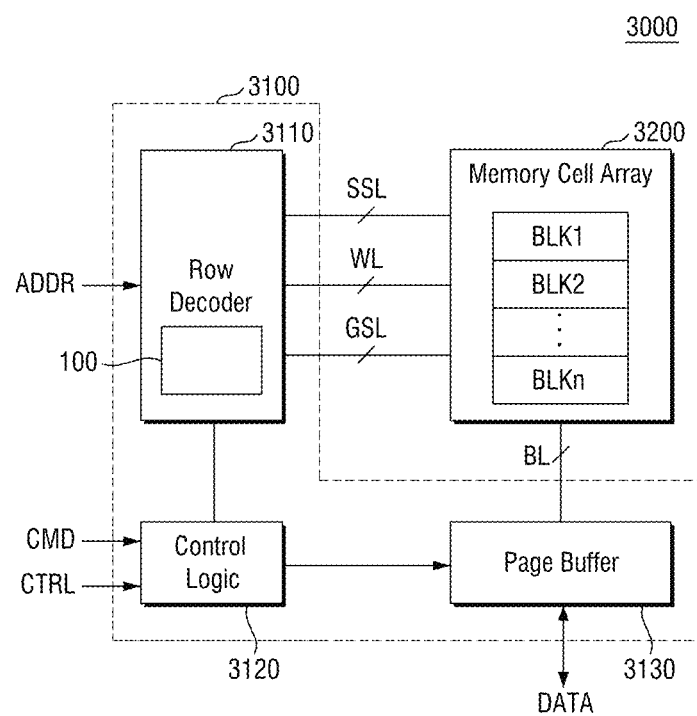
FIG. 18 is a block diagram of a semiconductor device including level shifter circuitry according to some example embodiments.

FIG. 18 is a block diagram of a semiconductor device including level shifter circuitry according to some example embodiments.

Referring to FIG. 18, a semiconductor device 3000 according to some example embodiments may include a memory cell array 3200 and/or a peripheral circuit 3100.

Although the semiconductor device 3000 may include, for example, a NAND flash memory, a vertical NAND (VNAND), a NOR flash memory, a resistive random access memory (RRAM), a phase-change memory (PRAM), a magneto resistive random access memory (MRAM), a ferroelectric random access memory (FRAM), a spin transfer torque random access memory (STT-RAM) and the like, example embodiments are not limited to these examples.

Hereinafter, although the technical idea of the present inventive concepts will be described by taking as an example that the semiconductor device 3000 is a vertical NAND (VNAND), some example embodiments according to the technical idea of the present inventive concepts are not limited to such examples. That is, example embodiments according to the technical idea of the present inventive concepts may be applied to the above-described nonvolatile memories.

The memory cell array 3200 may include a plurality of memory cell blocks BLK1 to BLKn. Each of the memory cell blocks BLK1 or BLKn may include a plurality of memory cells. The memory cell blocks BLK1 to BLKn may be connected to the peripheral circuit 3100 through the bit lines BL, the word lines WL, at least one string selection line SSL and at least one ground selection line GSL.

For example, the memory cell blocks BLK1 to BLKn may be connected to the row decoder 33 through the word lines WL, at least one string selection line SSL and at least one ground selection line GSL. Further, the memory cell blocks BLK1 to BLKn may be connected to the page buffer 3130 through the bit line BL.

The peripheral circuit 3100 may receive an address ADDR, a command CMD and/or a control signal CTRL from outside of the semiconductor device 3000, and may transmit and receive the data DATA to and from the device outside the semiconductor device 3000. The peripheral circuit 3100 may include control logic 3120, a row decoder 3110, and/or a page buffer 3130.

Although it is not shown, the peripheral circuit 3100 may further include various sub-circuits such as an input/output circuit, a voltage generation circuit that generates various voltages necessary for the operation of the semiconductor device 3000, and/or an error correction circuit for correcting the error of the data DATA read from the memory cell array 3200.

The control logic 3120 may be connected to the row decoder 3110, the voltage generation circuit, and/or the input/output circuit. The control logic 3120 may control the overall operations of the semiconductor device 3000. The control logic 3120 may generate various internal control signals used in the semiconductor device 3000 in response to the control signal CTRL.

For example, the control logic 3120 may transmit signal, which controls a voltage level provided to the word lines WL and the bit lines BL when performing the memory operations such as a program operation or an erase operation, to the row decoder 3110.

The row decoder 3110 may select at least one of the plurality of memory cell blocks BLK1 to BLKn in response to the address ADDR included in the internal control signal, and may select at least one word line WL of the selected memory cell blocks BLK1 to BLKn, at least one string selection line SSL and at least one ground selection line GSL. The row decoder 3110 may transfer a voltage for executing a memory operation to the word line WL of the selected memory cell blocks BLK1 to BLKn. The row decoder 3110 may enable the level shifting operation of the level shifter circuitry 100 according to the internal control signal. The level shifter circuitry 100 may perform level-shifting of an input voltage to a voltage corresponding to execution of the memory operations such as a program operation or an erase operation and output the input voltage.

The page buffer 3130 may be connected to the memory cell array 3200 through the bit lines BL. The page buffer 3130 may operate as a writer driver or a sense amplifier. For example, at the time of the program operation, the page buffer 3130 operates as a writer driver and may apply a voltage according to the data DATA to be stored in the memory cell array 3200 to the bit lines BL. On the other hand, at the time of read operation, the page buffer 3130 operates as the sense amplifier, and may detect the data DATA stored in the memory cell array 3200.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the preferred example embodiments without substantially departing from the principles of the present inventive concepts. Therefore, the disclosed preferred example embodiments of the inventive concepts are used in a generic and descriptive sense only and not for purposes of limitation.

What is claimed is:

1. Level shifter circuitry comprising:
    a first sub-circuit connected to a first power supply voltage;
    a second sub-circuit connected to a second power supply voltage; and
    a shifting circuit connected to the first and second sub-circuits, the shifting circuit configured to output the first power supply voltage or the second power supply voltage to an output terminal or an inverted output terminal in response to a signal applied to an input node in accordance with an enable signal,
    wherein the first sub-circuit includes,
        a first first-type transistor having one end connected to the first power supply voltage, and
        a second first-type transistor having one end connected to the first power supply voltage,
    wherein a gate of the first first-type transistor and a gate of the second first-type transistor are connected together to a first bias voltage generated by a first bias current,
    wherein the second sub-circuit includes,
        a first second-type transistor having one end connected to the second power supply voltage, and
        a second second-type transistor having one end connected to the second power supply voltage,
    wherein a gate of the first second-type transistor and a gate of the second second-type transistor are connected together to a second bias voltage generated by a second bias current, and
    wherein a voltage level of the enable signal is lower than the first power supply voltage and greater than the second power supply voltage.

2. The level shifter circuitry of claim 1, wherein the shifting circuit includes,
    at least a pair of pull-up transistors of at least one stage, and
    at least one pair of pull-down transistors of the at least one stage, one ends of the at least one pair of pull-down transistors being connected to one ends of the at least one pair of pull-up transistors,
    other ends of the at least one pair of pull-up transistors being connected to respective ones of the first first-type transistor and the second first-type transistor, and
    other ends of the at least one pair of pull-down transistors being connected to respective ones of the first second-type transistor and the second second-type transistor, and
    one pair of the at least one pair of pull-up transistors face each other and are cross-coupled with each other and one pair of the at least one pair of pull-down transistors face each other and are cross-coupled with each other.

3. The level shifter circuitry of claim 1, wherein the shifting circuit includes,
- a first pull-up transistor and a second pull-up transistor, the first pull-up transistor and the second pull-up transistor having one ends connected to the first first-type transistor and the second first-type transistor, and
- a first pull-down transistor and a second pull-down transistor, the first pull-down transistor and the second pull-down transistor having one ends connected to respective ones of the first second-type transistor and the second second-type transistor, and other ends connected to respective ones of other ends of the first pull-up transistor and the second pull-up transistor,
- gates of the first pull-up transistor and the second pull-up transistor are connected by a cross-coupled structure, and
- gates of the first pull-down transistor and the second pull-down transistor are connected by a cross-coupled structure.

4. The level shifter circuitry of claim 1, further comprising:
- an enable circuit configured to operate the shifting circuit in accordance with the enable signal.

5. The level shifter circuitry of claim 4, wherein the enable circuit includes an N-type transistor, to a gate of which the enable signal is applied,
- one end of the N-type transistor is connected to a ground voltage, and
- another end of the N-type transistor is connected to the input node.

6. The level shifter circuitry of claim 4, wherein the enable circuit includes a P-type transistor, to a gate of which the enable signal is applied,
- one end of the P-type transistor is connected to a first power supply voltage, and
- another end of the P-type transistor is connected to the input node.

7. The level shifter circuitry of claim 1, further comprising:
- a driving circuit configured to amplify an output signal of the shifting circuit to a preset voltage level range.

8. The level shifter circuitry of claim 1, further comprising:
- an inverter circuit configured to invert an output signal of the shifting circuit.

9. Level shifter circuitry comprising:
- at least two first pull-up transistors connected in series between a first power supply terminal and a first node;
- at least two second pull-up transistors connected in parallel to the first pull-up transistors and connected in series between the first power supply terminal and a second node;
- at least two first pull-down transistors connected in series between the first node and a second power supply terminal; and
- at least two second pull-down transistors connected in series between the second power supply terminal and the second node,
- wherein at least one of the second pull-up transistors faces and is cross-coupled to at least one of the first pull-up transistors,
- at least one of the second pull-down transistors faces and is cross-coupled to at least one of the first pull-down transistors so that an inverted output signal is output from the first node and an output signal is output from the second node,
- the first pull-up transistors include,
  - a first first-sub-pull-up transistor having one end connected to the first power supply terminal and including a gate connected to a first bias voltage generated by a first bias current, and
  - a first second-sub-pull-up transistor connected to the first power supply terminal, and
- the second pull-up transistors include,
  - a second first-sub-pull-up transistor having one end connected to the first power supply terminal and including a gate connected to the first bias voltage, and
  - a second second-sub-pull-up transistor connected to the first power supply terminal,
- a gate of the first second-sub-pull-up transistor and a gate of the second second-sub-pull-up transistor are connected together to a second bias voltage generated by a second bias current, and
- a voltage level of an enable signal applied to the level shifter circuitry is lower than a first power supply voltage applied to the first power supply terminal and greater than a second power supply voltage applied to the second power supply terminal.

10. The level shifter circuitry of claim 9, wherein the first pull-up transistors and the second pull-up transistors further include,
- a first shifting pull-up transistor connected to the other end of the first first-sub-pull-up transistor, the first node, and a first input node, and
- a second shifting pull-up transistor connected to the other end of the second first-sub-pull-up transistor, the second node, and a second input node, and
- the first shifting pull-up transistor and the second shifting pull-up transistor are cross-coupled.

11. The level shifter circuitry of claim 9, wherein the first pull-up transistors and the second pull-up transistors further include,
- a first shifting pull-up transistor connected between the other end of the first first-sub-pull-up transistor and a first input node,
- a second shifting pull-up transistor which has a gate cross-coupled to the first shifting pull-up transistor, and is connected to the other end of the second first-sub-pull-up transistor and a second input node,
- a third shifting pull-up transistor which has a gate to which a third power supply terminal (V_BIAS1) is connected, and connected between the first input node and the first node, and
- a fourth shifting pull-up transistor which has a gate to which the third power supply terminal is connected, and is connected between the second input node and the first node.

12. The level shifter circuitry of claim 9, wherein the first pull-down transistors and the second pull-down transistors further include
- a first sub-pull-down transistor and a second sub-pull-down transistor each having one end connected to the second power supply terminal and a gate connected to a second bias,
- a first shifting pull-down transistor connected to the other end of the first sub-pull-down transistor and the first node, and a second shifting pull-down transistor connected to the other end of the second sub-pull-down transistor and the first node, and the first shifting pull-down transistor and the second shifting pull-down transistor are cross-coupled.

13. The level shifter circuitry of claim 9, wherein the first pull-down transistors and the second pull-down transistors further include, a first sub-pull-down transistor and a second sub-pull-down transistor each having one end connected to the second power supply terminal and a gate connected to a second bias, a first shifting pull-down transistor having one end connected to the other end of the first sub-pull-down transistor, a second shifting pull-down transistor having a gate cross-coupled to the first shifting pull-down transistor, and one end connected to the other end of the second sub-pull-down transistor, a third shifting pull-down transistor which has a gate to which a third power supply terminal is connected, and is connected between the other end of the first shifting pull-down transistor or a third input node and the first node, and a fourth shifting pull-down transistor which has a gate to which a fourth power supply terminal is connected, and is connected between the other end of the second shifting pull-down transistor or a fourth input node and the first node.

14. The level shifter circuitry of claim 9, further comprising:

transistors having gates to which an enable signal is applied, one ends connected to a ground voltage, and other ends connected to each of the first input node and the second input node.

15. The level shifter circuitry of claim 13, further comprising:

transistors having gates to which an enable signal is applied, one ends A connected to a first power supply voltage, and other ends connected to the third input node and the fourth input node.

16. An image sensor comprising:

a first layer including a pixel array; and a second layer below the first layer and including a row driver for driving the pixel array, wherein the row driver includes a plurality of level shifter circuits in an array, and each of the level shifter circuits includes, a first sib-circuit connected to a first power supply voltage, the first sub-circuit including a first first-type transistor have one end connected to the first power supply voltage and a second first-type transistor having one end connected to the first power supply voltage, a gate of the first first-type transistor and a gate of the second first-type transistor being connected together to a first bias current, and a second sub-circuit including a first second-type transistor having one end connected to the second power supply voltage and a second second-type transistor having one end connected to the second power supply voltage, at least two first pull-up transistors connected in series between the first sub-circuit and a first node, at least two second pull-up transistors connected in parallel to the first pull-up transistors and connected in series between the first sub-circuit and a second node, at least two first pull-down transistors connected in series between the first node and a second power supply terminal, and at least two second pull-down transistors connected in series between the second power supply terminal and the second nodes, at least one of the at least two second pull-up transistors faces and is cross-coupled to at least one of the at least two first pull-up transistors, and at least one of the at least two second pull-down transistors faces and is cross-coupled to at least one of the at least two first pull-down transistors so that an inverted output signal is output from the first node and an output signal is output from the second node, in accordance with an enable signal, a gate of the first second-type transistor and a gate of the second second-type transistor are connected together to a second bias voltage generated by a second bias current, and a voltage level of the enable signal applied to each of the level shifter circuits is lower than the first power supply voltage and greater than the second power supply voltage.

17. The image sensor of claim 16, wherein each of the level shifter circuits includes an N-type transistor having a gate to which the enable signal is applied, one end connected to a ground voltage, and another end connected to an input node.

18. The image sensor of claim 17, wherein the enable signal includes a first enable signal which is input to the first node, and a second enable signal which is input to the second node, and the first enable signal and the second enable signal are signals opposite to each other.

* * * * *